(12) United States Patent
Brahma et al.

(10) Patent No.: US 12,341,333 B2
(45) Date of Patent: Jun. 24, 2025

(54) TOPOLOGY AGNOSTIC DETECTION AND LOCATION OF FAULT IN DC MICROGRID USING LOCAL MEASUREMENTS

(71) Applicant: CLEMSON UNIVERSITY, Clemson, SC (US)

(72) Inventors: Sukumar Brahma, Clemson, SC (US); Munim Bin Gani, Clemson, SC (US)

(73) Assignee: CLEMSON UNIVERSITY RESEARCH FOUNDATION, Clemson, SC (US)

( * ) Notice: Subject to any disclaimer, the term of this patent is extended or adjusted under 35 U.S.C. 154(b) by 319 days.

(21) Appl. No.: 17/899,173

(22) Filed: Aug. 30, 2022

(65) Prior Publication Data
US 2023/0076181 A1    Mar. 9, 2023

Related U.S. Application Data

(60) Provisional application No. 63/242,253, filed on Sep. 9, 2021.

(51) Int. Cl.
| | |
|---|---|
| *H02H 3/00* | (2006.01) |
| *G01R 19/25* | (2006.01) |
| *H02H 1/00* | (2006.01) |
| *H02H 3/20* | (2006.01) |

(52) U.S. Cl.
CPC ......... *H02H 3/202* (2013.01); *G01R 19/2513* (2013.01); *H02H 1/0007* (2013.01)

(58) Field of Classification Search
None
See application file for complete search history.

(56) References Cited

U.S. PATENT DOCUMENTS

| | | | |
|---|---|---|---|
| 8,842,401 B2 | 9/2014 | Hill et al. | |
| 9,007,735 B2 | 4/2015 | Park | |
| 2017/0331274 A1* | 11/2017 | Akke | G01R 31/086 |
| 2018/0076658 A1* | 3/2018 | Mannuccini | H02M 7/44 |

OTHER PUBLICATIONS

Augustine et al. "DC microgrid protection: Review and challenges," Sandia National Laboratories, New Mexico, USA, Tech. Rep. SAND2018-8853, Aug. 2018.

(Continued)

*Primary Examiner* — Stephen W Jackson
(74) *Attorney, Agent, or Firm* — DORITY & MANNING, P.A.

(57) ABSTRACT

Systems and methods of determining fault location on a DC microgrid feeder need to be extremely fast to protect the circuit breaker and converter-source components. This disclosure develops a seminal theoretical foundation for fast fault location on a DC feeder that uses only single-ended local measurements in time domain. The theory provides a closed-form deterministic solution for fault location, making the resulting fault location method agnostic to system-topology and immune to fault resistance. The theory is developed with ideal DC voltage sources and is extended to practical converter-sources. The performance of the resulting method is demonstrated by simulating a DC feeder with converters connected at both ends, modeled in PSCAD (power systems computer-aided design).

17 Claims, 9 Drawing Sheets

(56) References Cited

OTHER PUBLICATIONS

Azizi et al. "A traveling wave-based methodology for wide-area fault location in multiterminal DC systems," IEEE Transactions on Power Delivery, vol. 29, No. 6, pp. 2552-2560, 2014.
Beheshtaein et al. "DC microgrid protection: A comprehensive review," IEEE Journal of Emerging and Selected Topics in Power Electronics, pp. 1-1, 2019.
Bhargav et al. "Novel fault detection and localization algorithm for low-voltage DC microgrid," IEEE Transactions on Industrial Informatics, vol. 16, No. 7, pp. 4498-4511, 2020.
Brigitte Hauke "Basic calculation of a boost converter's power stage," Texas Instruments, Texas, USA, Tech. Rep. SLVA372C, Nov. 2009.
De Olivieira et al. "Grounding and safety considerations for residential DC microgrids," in IECON 2014—40th Annual Conference of the IEEE Industrial Electronics Society, 2014, pp. 5526-5532.
Feng et al. "A novel fault location method and algorithm for DC distribution protection," IEEE Transactions on Industry Applications, vol. 53, No. 3, pp. 1834-1840, 2017.
Fletcher et al. "Determination of protection system requirements for DC unmanned aerial vehicle electrical power networks for enhanced capability and survivability," IET Electrical Systems in Transportation, vol. 1, No. 4, pp. 137-147, 2011.
Fletcher et al. "High-speed differential protection for smart DC distribution systems," IEEE Transactions on Smart Grid, vol. 5, No. 5, pp. 2610-2617, 2014.
Fletcher et al. "Optimizing the roles of unit and non-unit protection methods within DC microgrids," IEEE Transactions on Smart Grid, vol. 3, No. 4, pp. 2079-2087, Dec. 2012.
G. M. Masters "Renewable and Efficient Electric Power Systems", 2nd ed. Hoboken, New Jersey: John Wiley & Sons, 2013, ch. 3, sec. 9.2, p. 174.
Gautam et al. "Detection of high impedance fault in power distribution systems using mathematical morphology," IEEE Transactions on Power Systems, vol. 28, No. 2, pp. 1226-1234, 2013.
Havells "LT/HT Power & Control Cables" Accessed Jun. 5, 2021 [pdf]. [Online]. Available:https://www.havells.com/content/dam/havells/brouchers/Industrial%20Cable/Cable%20Catalogue-2016.pdf[25].
Kaipia et al. "Field test environment for lvDC distributio-implementation experiences," in CIRED 2012 Workshop: Integration of Renewables into the Distribution Grid, 2012, pp. 1-4.
Kakigano et al. "Low-voltage bipolar-type DC microgrid for super high quality distribution," IEEE Transactions on Power Electronics, vol. 25, No. 12, pp. 3066-3075, 2010.
Kong et al. "Optimization of current breaker and fault current limiter in DC micro-grid based on faulty transient analysis," in 2018 21st International Conference on Electrical Machines and Systems (ICEMS), 2018, pp. 2017-2022.
Meghwani et al. "A new protection scheme for DC microgrid using line current derivative," in 2015 IEEE Power Energy Society General Meeting, 2015, pp. 1-5.
Meghwani et al. "A non-unit protection scheme for DC microgrid based on local measurements," IEEE Transactions on Power Delivery, vol. 32, No. 1, pp. 172-181, 2017.

Meghwani et al. "An on-line fault location technique for DC microgrid using transient measurements," in 2017 7th International Conference on Power Systems (ICPS), 2017, pp. 386-391.
Meghwani et al. "Local measurement based technique for estimating fault location in multi-source DC microgrids," IET Generation, Transmission Distribution, vol. 12, No. 13, pp. 3305-3313, 2018.
Mobarrez et al. "Grounding architectures for enabling ground fault ride-through capability in DC microgrids," in 2017 IEEE Second International Conference on DC Microgrids (ICDCM), 2017, pp. 81-87.
Mohanty et al. "An accurate noniterative fault-location technique for low-voltage DC microgrid," IEEE Transactions on Power Delivery, vol. 31, No. 2, pp. 475-481, 2016.
Monadi et al. "Centralized protection strategy for medium voltage DC microgrids," IEEE Transactions on Power Delivery, vol. 32, No. 1, pp. 430-440, 2017.
Nanayakkara et al. "Traveling wave-based line fault location in star-connected multiterminal hvDC systems," IEEE Transactions on Power Delivery, vol. 27, No. 4, pp. 2286-2294, 2012.
Nexans Energy "Service Cable Products", Accessed Feb. 3, 2020 [pdf].
Nilsson et al "Electric Circuits", 9th ed. One Lake Street, Upper Saddle River, New Jersey: Prentice Hall, 2011, ch. 7, sec. 7.1, p. 217.
Noh et al. "Development of fault section identification technique for low voltage DC distribution systems by using capacitive discharge current," Journal of Modern Power Systems and Clean Energy, vol. 6, No. 3, pp. 509-520, 2018.
Pradhan et al. "Cable fault location in a DC microgrid using current injection technique," in 2016 National Power Systems Conference (NPSC), 2016, pp. 1-6.
PSRC Working Group D15 "High impedance fault detection technology," Tech. Rep., Accessed Aug. 23, 2020 [pdf]. [Online]. Available: https://www.pes-psrc.org/kb/published/reports/High Impedance Fault Detection Technology.pdf.
Reddy et al. "Fault detection and location estimation for lvDC microgrid using self parametric measurements," International Transactions on Electrical Energy Systems, 2020 p. e12499.
Salamonsson et al. "Protection of low-voltage DC microgrids," IEEE Transactions on Power Delivery, vol. 24, No. 3, pp. 1045-1053, 2009.
Sel Inc. "Ultra-High-Speed Transmission Line Relay Traveling-Wave Fault Locator High-Resolution Event Recorder" SEL-T400L Time-Domain Line Protection SEL, retrieved from internet: chrome-extension://efaidnbmnnnibpcajpcglclefindmkaj/https://selinc.com/api/download/116461/.
Tektronix "MSO/DPO70000DX Series Datasheet" Mixed Signal and Digital Phosphor Oscilloscopes, retrieved from internet; chrome-extension://efaidnbmnnnibpcajpcglclefindmkaj/file://nas01/gdrive/CitrixUsers/cgraves/Downloads/DPO-DSA-MSO70000-DataSheet-EN-21Aug23.pdf.
Ukil et al. Fault Analysis and Protection System Design for DC Grids, 1st ed. Singapore: Springer Nature Singapore Pte Ltd, 2020.
Yang et al. "Artificial neural network based fault detection and fault location in the DC microgrid," Energy Procedia, vol. 103, pp. 129-134, 2016, renewable Energy Integration with Mini/Microgrid—Proceedings of REM2016.
Yuan et al. "Protection strategies for medium-voltage direct-current microgrid at a remote area mine site," IEEE Transactions on Industry Applications, vol. 51, No. 4, pp. 2846-2853, 2015.

* cited by examiner

| Time after $t_0$ | $v_1$ (V) | $i_1$ (A) | $di_1/dt$ (A/s) | $x$ (m) |
|---|---|---|---|---|
| $x^{(1)} = 80$ m | | | | |
| 20 $\mu s$ | 400 | 407.9 | 1.675E7 | |
| 30 $\mu s$ | 400 | 568.3 | 1.548E7 | 80.4 |
| 50 $\mu s$ | 400 | 853.7 | 1.322E7 | 80.4 |
| $x^{(2)} = 40$ m | | | | |
| 20 $\mu s$ | 400 | 435.5 | 3.674E7 | |
| 30 $\mu s$ | 400 | 1118.4 | 3.190E7 | 40.2 |
| 50 $\mu s$ | 400 | 1711.3 | 2.770E7 | 40.2 |

FIG. 10 (TABLE I)

TABLE II: Parameters of the test system.

| Network component/ parameter | Value |
|---|---|
| Rated voltage | 400 V |
| Converter rating | 100 kW |
| Converter low voltage, $V_{in}$ | 200 V |
| Switching frequency of converter | 20 kHz |
| DC link capacitor, $C_f$ | 2 mF |
| Converter inductor, $L_{conv}$ | 1 mH |
| Cable resistance [33] | 0.0991 m$\Omega$/m |
| Cable inductance [33] | 0.2929 $\mu$H/m |
| Cable capacitance [33] | 1.44 nF/m |
| Cable ampacity [33] | 260 A |
| Cable length | 100 m |
| Load at Bus 2 | 100 kW |

FIG. 11 (TABLE II)

| $R_f$ $\Omega$ | Sampling Frequency | Percentage error achieved at corresponding sampling frequency |
|---|---|---|
| 0.01 | 100 kHz | -1.29% |
| 0.1 | 1000 kHz (1 MHz) | -1.09% |
| 1 | 10 MHz | -1.05% |
| 10 | 100 MHz | -0.9% |
| 100 | 1000 MHz | 0.93% |

FIG. 12 (TABLE III)

| Sampling frequency | Fault location error |
|---|---|
| 1 MHz | -20.67% |
| 2 MHz | -10.60% |
| 5 MHz | -4.27% |
| 8 MHz | -2.67% |
| 10 MHz | -2.14% |

FIG. 13 (TABLE IV)

| Sampling frequency | Fault location error |
|---|---|
| 1 MHz | -0.18% |
| 666.67 kHz | -0.26% |
| 500 kHz | -0.32% |
| 200 kHz | -0.71% |
| 100 kHz | -1.29% |

FIG. 14 (TABLE V)

| Fault Distance | % Error with increasing sampling freq. | | |
|---|---|---|---|
| | 1 MHz | 5 MHz | 10 MHz |
| 5% | -0.160% | -0.050% | -0.060% |
| 20% | -0.132% | -0.016% | -0.010% |
| 50% | -0.094% | -0.016% | -0.006% |
| 80% | -0.180% | -0.024% | -0.010% |
| 95% | -0.377% | -0.074% | -0.035% |

FIG. 15 (TABLE VI)

| Capacitor Size ($\mu F$) | Switching Freq. (kHz) | % Error | |
|---|---|---|---|
| | | $R_f = 0.1$ $\Omega$ | $R_f = 0.01$ $\Omega$ |
| 781.25 | 20 | -1.400% | -0.147% |
| 156.25 | 100 | -0.494% | -0.243% |

FIG. 16 (TABLE VII)

TOPOLOGY AGNOSTIC DETECTION AND LOCATION OF FAULT IN DC MICROGRID USING LOCAL MEASUREMENTS

CROSS REFERENCE TO RELATED APPLICATION

This application claims filing benefit of U.S. Provisional Patent Application Ser. No. 63/242,253, entitled "Topology Agnostic Detection and Location of Fault in DC Microgrid Using Local Measurements," having a filing date of Sep. 9, 2021, which is incorporated herein by reference for all purposes.

GOVERNMENT SUPPORT CLAUSE

This invention was made with government support under Grant No. 2143420, awarded by Sandia National Laboratories. The government has certain rights in the invention.

FIELD

The present disclosure relates generally to fault detection and fault location. More particularly, the present subject matter relates to detecting a fault and determining the fault location on a DC feeder within a critical time, using only single-ended local measurements.

BACKGROUND

Despite the clear advantages of DC distribution systems over AC, DC distribution microgrids have not gained much commercial success due to some major challenges. One challenge is the much faster protection needed for the safety of converter components and circuit breakers. In other words, systems and methods of determining fault location on a DC microgrid feeder, which must precede operation of a circuit breaker to clear the fault, need to be extremely fast to protect the circuit breaker and converter-source components. This disclosure develops a seminal theoretical foundation for fast fault location on a DC feeder that uses only single-ended local measurements (using measurements only at one bus) in time domain. The theory provides a closed-form deterministic solution for fault location, and the resulting method is agnostic to system topology and immune to fault resistance. The theory is developed with ideal DC voltage sources and is extended to practical converter sources, and the performance of the resulting method is demonstrated by simulating a DC feeder with converters connected at both ends, modeled in Power Systems Computer-Aided Design (PSCAD).

With microgrids emerging as building blocks for future power delivery paradigm, DC networks are being conceived to be a better alternative than the traditional AC networks[1]. Most of the generation at the distribution level is typically solar photovoltaic (PV), often supported by battery storage. These sources are DC. Modern loads like laptops, computers, TV, cell phone chargers, and electric vehicles operate on DC as well. Thus, DC microgrids can be less lossy as they would require fewer conversion stages. In terms of operating complexity, there is no need for reactive power generation or frequency regulation in DC systems, resulting in better and simpler control of power.

Despite the benefits, implementation of DC microgrids at the commercial scale is obstructed by some challenges, one of which is unusually fast protection requirements, typically in tens of microseconds, caused by the following two constraints: First, in response to a fault, current in DC circuits rises in a matter of tens of microseconds[2], without having a natural current zero. If the fault current crosses the breaking limit of the controlling circuit breaker, it cannot be interrupted. Secondly, in a DC microgrid, DC-DC converters are used to interface renewable sources to the microgrid, and AC-DC rectifiers are used to connect the microgrid with the AC grid. These converters and rectifiers are made of power electronic devices such as diodes and IGBTs and have capacitors connected at their DC side, known as DC-link capacitors. When a fault occurs in a DC microgrid, current from these capacitors dominates at first[3]-[5]. After the capacitor voltage drops to a critical value, a high fault current starts to flow through the power electronic devices[3],[6], exposing them to damage. Thus, another protection challenge in DC microgrids is to isolate the fault before the current goes beyond the limit of the power electronic circuitry.

The published literature on protection of DC microgrids can be divided into two main categories: Those which use local measurements only and those which use remote measurements as well, and hence, need communication[7]-[9]. Since communication introduces delays and uncertainties, which are counterproductive to fast and reliable protection, schemes using local measurements only will be discussed here. Prior art indicates a local measurement-based fault location method used for bolted faults only; for any other fault involving a resistance, authors had to use communication[11]. An inductance-based fault location method was proposed[34],[35], but the method can only be applied if the system is radial, and the fault current is being sourced from one end only. However, a DC microgrid will certainly have multiple sources, and therefore, a fault will be fed from both ends of the faulted feeder.

Some other methods in published literature also use only local measurements for fault detection[4],[10]. These methods use current derivatives for fault detection which creates system dependency as derivatives change with the location of fault on a given feeder, as well as with topology of the network, thus severely restricting the generality of application. Further, a current limiting inductance is inserted in series with cables, and voltage across the inductance is used for fault detection[6]. This can also be related to the current derivative approach because voltage across an inductance is directly proportional to the current derivative. Setting thresholds using this approach are determined through rigorous simulation of the entire system, which underscores their system dependency.

There are very few works that determine the exact location of the fault after detecting it. In some, the faulted section is isolated, but the location of fault on that section is not determined[4],[10]. In others, fault location is determined through communication[11]. Certain schemes use iterative methods for determining fault location, but the execution time of such iterative methods is variable; their convergence is dependent upon the initial guesses and the numerical condition of various steps used in the process. In addition, the execution time increased with increasing distance to the fault point[3],[6].

Some authors propose fault location methods by using a power probe unit (PPU) and a portable current injection kit (CIK), respectively[12]-[13],[3]. However, these are offline techniques and can only be used once the faulted section is isolated by some other means. Also, as PPU or CIK are only used in locating the fault, these add extra costs to the system.

Traveling wave-based methods were used in a number of papers for locating faults in HVDC systems[14],[15]. However, a traveling wave-based method is not practical for DC microgrids. Due to the complex topology of the distribution system, a large number of reflections take place, compromising the accuracy of the method[16]. Additionally, very short feeder lengths, characteristic of DC microgrids, hamper the process of isolating traveling waves.

Machine learning-based approaches are also tried for DC microgrid protection. For example, two different Artificial Neural Networks (ANNs) were used for fault location and fault detection in a 4-bus ring type DC microgrid[17]. This method is system dependent as any change in the network will require a new set of simulations to train the ANN again with new circuit parameters. It is also practically impossible to show that the method performs well for every fault at any distance with any fault resistance. Moreover, lack of field data compromises the validity of such machine learning based approaches.

The reason all methods proposed for single-ended fault location are system dependent is that the biggest hurdle for any single-ended fault location approach is the unknown fault resistance. Thus, many prior methods have drawbacks that they are either 1) system dependent; 2) need communication (not local); or 3) are not closed form (iterative).

SUMMARY

Aspects and advantages of embodiments of the present disclosure will be set forth in part in the following description, may be learned from the description, or may be learned through practice of the embodiments.

In general, it is a present object to provide for a fast fault detection and location technique that uses only single-ended local measurements in time domain. A major hurdle in development of DC microgrids is fast and selective protection. This is being comprehensively solved by the presently disclosed technology.

The presently disclosed technology can also be potentially applicable for high voltage DC (HVDC), which is significant since HVDC lines are part of most power systems. The presently disclosed technology can also be applicable to voltage source converter (VSC)-based HVDC transmission lines.

To overcome above-referenced drawbacks, this disclosure develops a deterministic closed-form mathematical formulation using time domain data sampled at high frequency that makes the fault location immune to fault resistance. Because relatively higher frequencies in some environments can make the technology vulnerable to measurement noises, for some embodiments, filtering might be practiced to avoid any issue. Technology to sample voltage and current waveforms at sampling rates required by this formulation is already commercially implemented in AC power systems.

Since the formulation uses only the total resistance and inductance of the protected feeder, the method is topology-agnostic, thus amenable to be used on any feeder in any DC microgrid. It can be implemented in both radial and meshed networks. The only constraint is that the data should be sampled at a high enough frequency for the current derivative to be calculated accurately. By properly adjusting the sampling frequency, high-resistance faults can also be located by this method. The fault is detected and located simultaneously using only three fault samples, which means that for a sampling frequency of 1 MHz (assumed in this disclosure), the time taken is just 3 µs. Since commercially available relays already use this sampling frequency[18] and oscilloscopes support even higher sampling frequencies[19], this assumption is reasonable. Since the formulation uses the total resistance and inductance of only the protected feeder, the resulting method becomes system-independent, i.e., any change in the operating parameters of the system or any topological change in the network will not impact the detection or location of fault by this method. By properly adjusting the sampling frequency, high-resistance faults can also be detected and located by this method.

It is to be understood that the presently disclosed subject matter equally relates to associated and/or corresponding methodologies. One exemplary such method relates to a method of protecting a DC feeder electrical power network including the steps of: 1) providing one or more circuit breaker arrangements which, on activation, isolate electrical faults within the network; 2) sampling voltage and current of the network at a relatively high sampling rate; 3) determining the occurrence of and location of a fault in the network based on the sampled voltage and current; and 4) activating one or more of the circuit breaker arrangements in response to determining the occurrence of a fault.

Another presently disclosed exemplary embodiment relates to a method of detecting and handling faults in a DC power transmission or distribution system network using only single-ended local measurements in time domain. Such method preferably comprises: 1) providing one or more circuit breaker arrangements which, on activation, isolate electrical faults within the network; 2) conducting three consecutive samplings of the network voltage and current at a relatively high sampling rate of up to about 1 MHz; 3) determining the occurrence of a fault in the network based on calculating a current derivative from the sampled voltage and current; and 4) activating one or more of the circuit breaker arrangements in response to determining the occurrence of a fault.

Other example aspects of the present disclosure are directed to systems, apparatus, tangible, non-transitory computer-readable media, user interfaces, memory devices, and electronic devices for fault detection.

Another presently disclosed exemplary embodiment relates to a fault protection system for protecting a DC feeder electrical power network. Such system preferably comprises: 1) one or more circuit breaker arrangements which, on activation, isolate electrical faults within the network; 2) one or more processors programmed for sampling voltage and current of the network at a relatively high sampling rate; 3) determining the occurrence of and location of a fault in the network based on the sampled voltage and current; and 4) activating one or more of the circuit breaker arrangements in response to determining the occurrence of a fault.

Additional objects and advantages of the presently disclosed subject matter are set forth in, or will be apparent to, those of ordinary skill in the art from the detailed description herein. Also, it should be further appreciated that modifications and variations to the specifically illustrated, referred and discussed features, elements, and steps hereof may be practiced in various embodiments, uses, and practices of the presently disclosed subject matter without departing from the spirit and scope of the subject matter. Variations may include, but are not limited to, substitution of equivalent means, features, or steps for those illustrated, referenced, or discussed, and the functional, operational, or positional reversal of various parts, features, steps, or the like.

Still further, it is to be understood that different embodiments, as well as different presently preferred embodiments, of the presently disclosed subject matter may include various combinations or configurations of presently disclosed features, steps, or elements, or their equivalents (including combinations of features, parts, or steps or configurations thereof not expressly shown in the figures or stated in the detailed description of such figures). Additional embodiments of the presently disclosed subject matter, not necessarily expressed in the summarized section, may include and incorporate various combinations of aspects of features, components, or steps referenced in the summarized objects above, and/or other features, components, or steps as otherwise discussed in this application. Those of ordinary skill in the art will better appreciate the features and aspects of such embodiments, and others, upon review of the remainder of the specification, and will appreciate that the presently disclosed subject matter applies equally to corresponding methodologies as associated with practice of any of the present exemplary devices, and vice versa.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

A full and enabling disclosure of the presently disclosed subject matter, including the best mode thereof, directed to one of ordinary skill in the art, is set forth in the specification, which makes reference to the appended figures, in which:

FIG. 10, comprising Table I, is a chart of calculated distance x from Bus 1 to fault per a presently disclosed example in the subject specification;

FIG. 11, comprising Table II, is a chart of parameters per a presently disclosed test system example in the subject specification;

FIG. 12, comprising Table III, is a chart of performance of the presently disclosed method listing the sampling frequencies required to get the fault location error within ±1.5%;

FIG. 13, comprising Table IV, is a chart of performance of the presently disclosed method with high resistance fault (Rf=2Ω) with increasing sampling frequency;

FIG. 14, comprising Table V, is a chart of performance of the presently disclosed method with low resistance fault (Rf=0.01Ω) with decreasing sampling frequency;

FIG. 15, comprising Table VI, is a chart of performance of the presently disclosed method with varying fault distance;

FIG. 16, comprising Table VII, is a chart of performance of the presently disclosed method with varying DC link capacitor size;

Figure 1A:
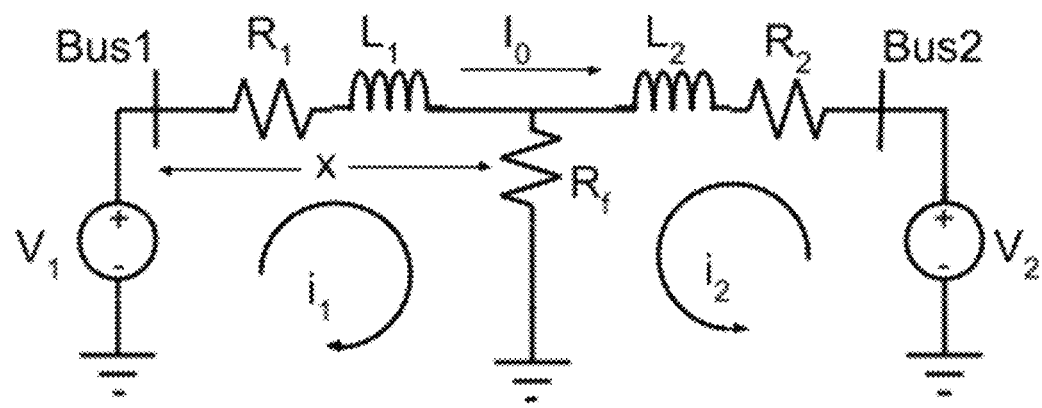
FIG. 1A is an exemplary presently disclosed time domain representation schematic of a two bus DC circuit with ideal DC sources.

Repeat use of reference characters in the present specification and drawings is intended to represent the same or analogous features or elements or steps of the presently disclosed subject matter.

DETAILED DESCRIPTION

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

INTRODUCTION

The rest of the disclosure includes Section II, theoretical proof of the proposed method with ideal DC voltage sources; Section III, which validates the theory with simulated data; Section IV, which shows how the method is applicable to a practical test feeder fed by converter-based sources; Section V, which shows how the method can be adapted for any value of fault resistance; Section VI, which includes sensitivity analysis of this method with respect to various parameters; and Section VII, which concludes the disclosure and describes future work.

II. Derivation of Theory for the Proposed Method with Ideal Sources

A. Fault Currents

FIG. 1A shows a two-bus DC system with a DC feeder connected between Bus 1 and Bus 2. Two voltage sources with steady state values $V_1$ and $V_2$ are feeding the line from the two buses. At a distance x from Bus 1, a fault with a fault resistance Rr is assumed. Current $I_0$ is flowing from Bus 1 to Bus 2 before the fault. Due to short lines in DC microgrids, line capacitance is ignored in FIG. 1, and the line is approximated with an inductance and a resistance only. Other circuit parameters used in the development of theory are as follows:

$R_1$, $L_1$=resistance and inductance, respectively, of line section from Bus 1 to fault.
$R_2$, $L_2$=resistance and inductance, respectively, of line section from Bus 2 to fault.
R, L=total resistance and inductance of line.
r, l=resistance and inductance per unit length of the line.

• $\tau_L = \frac{L_1}{R_1} = \frac{L_2}{R_2}$ = time constant of the line.

$i_2$=Current from Bus 1 to fault.
$i_2$=Current from Bus 2 to fault.

Figure 1B:
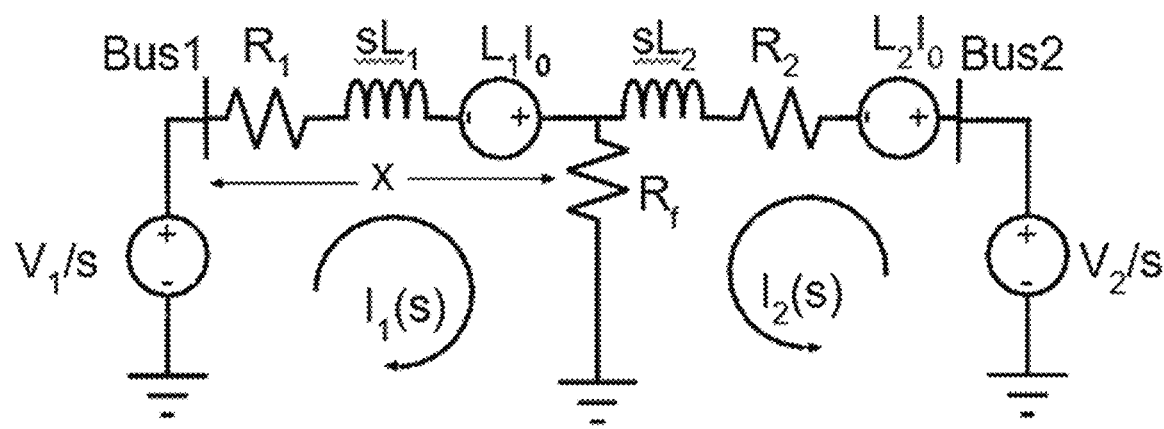
FIG. 1B is an exemplary presently disclosed s-domain representation schematic of a two bus DC circuit with ideal DC sources.

FIG. 1B shows the s domain equivalent of the circuit of FIG. 1A. $I_1(s)$ and $I_2(s)$ denote the s domain equivalent of currents $I_1$ and $I_2$, respectively, and will be denoted simply as $I_1$ and $I_2$ during derivation. Applying KVL to the circuit in FIG. 1B, we get $$(s^2L_1+s(R_1+R_f))I_1+sR_fI_2=V_1+sL_1I_0 \quad (1)$$

$$sR_fI_1+(s^2L_2+s(R_2+R_f))I_2=V_2-sL_2I_0 \quad (2)$$

If Eqs. 1 and 2 are solved for $I_1(s)$, $I_2(s)$ and subsequent inverse Laplace transforms are performed to get $i_1(t)$ and $i_2(t)$, the following expressions are obtained:

$$i_1(t)=K_1+K_3*e^{-(-\lambda_L+\lambda_f)t} \quad (3)$$

$$i_2(t)=K'_1+K'_3*e^{-(-\lambda_L+\lambda_f)t} \quad (4)$$

where $$\lambda_L = \frac{1}{\tau_L} = \frac{R}{L}; \lambda_f = \frac{R_f}{L_p} = \frac{R_f}{L_1 \| L_2}$$

and $K_1$, $K_3$, $K'_1$, $K'_3$ are constants.

Stepwise derivation is provided in the supplementary material (Appendix A) submitted with this disclosure, and Appendix B calculates coefficients $K_1$ and $K_3$ for Section III using the relevant data from Eq. 13. Both Appendices A and B are part of this specification.

B. Fault Location Using Local Measurements

From Eqs. 3 and 4, the pre-fault current is $$I_0=K_1+K_3=-(K'_1+K'_3) \quad (5)$$

Subtracting $I_0$ from Eq. 3, and adding the result to Eq. 4, the following expressions can be obtained:

$$i_1(t)-I_0=K_1+K_3*e^{-(-\lambda_L+\lambda_f)t}-K_1-K_3 \Rightarrow i_1(t)-I_0= K_3*(e^{-(-\lambda_L+\lambda_f)t}-1) \quad (6)$$

and, $$i_2(t)+I_0=K'_1+K'_3*e^{-(-\lambda_L+\lambda_f)t}-K'_1-K'_3 \Rightarrow i_2(t)+I_0=K'_3* (e^{-(-\lambda_L+\lambda_f)t}-1) \quad (7)$$

Dividing Eq. 7 by Eq. 6, Eq. 8 is obtained:

$$\frac{i_2(t)+I_0}{i_1(t)-I_0} = \frac{K'_3}{K_3} = m \quad (8)$$

$$\Rightarrow i_2(t)+I_0 = m*(i_1(t)-I_0)$$

$$\Rightarrow i_2(t) = m*i_1(t) - (m+1)I_0$$

If the instantaneous fault voltage during the fault is $v_f(t)$, with corresponding source voltage at the sending end in FIG. 1A being $v_1(t)$, $$v_1(t) = x\left[l*\frac{di_1(t)}{dt} + ri_1(t)\right] + v_f(t) \quad (9)$$

$$\Rightarrow v_1(t) = x\left[l*\frac{di_1(t)}{dt} + ri_1(t)\right] + R_f(i_1(t)+i_2(t))$$

Using the expression of $i_2(t)$ from Eq. 8 in Eq. 9 and re-organizing terms, Eq. 10 can be obtained:

$$v_1(t) = x\left[l*\frac{di_1(t)}{dt} + ri_1(t)\right] + R_f(m+1)(i_1(t)-I_0) \quad (10)$$

If $v_1$, $i_1$, $$\frac{di_1}{dt}$$

can be measured at two different times $t_1$ and $t_2$, Eq. 11 and Eq. 12 can be formed:

$$v_1(t_1) = x\left[l*\frac{di_1(t_1)}{dt} + ri_1(t_1)\right] + R_f(m+1)(i_1(t_1)-I_0) \quad (11)$$

$$v_1(t_2) = x\left[l*\frac{di_1(t_2)}{dt} + ri_1(t_2)\right] + R_f(m+1)(i_1(t_2)-I_0) \quad (12)$$

From Eqs. 11 and 12, the location of fault, x, can be expressed as:

$$x = \frac{\begin{vmatrix} v_1(t_1) & i_1(t_1)-I_0 \\ v_1(t_2) & i_1(t_2)-I_0 \end{vmatrix}}{\begin{vmatrix} l*\frac{di_1(t)}{dt}\bigg|_{t=t_1} + r*i_1(t_1) & i_1(t_1)-I_0 \\ l*\frac{di_1(t)}{dt}\bigg|_{t=t_2} + r*i_1(t_2) & i_1(t_2)-I_0 \end{vmatrix}} \quad (13)$$

Notice that Eq. 13 provides a closed-form solution for fault location that does not include the fault resistance term $R_f$. Samples of voltage and current at time $t_1$ and $t_2$ can be measured, and if the sampling rate is high enough (1 MHz assumed in this disclosure), current derivative $di_1/dt$ can also be accurately measured. Thus, Eqs. 11 and 12 can be solved for fault location x and $R_f(m+1)$. Three consecutive readings are needed to solve the two equations, as two samples are needed to calculate $di_1/dt$. This translates to a solution time of just 3 μs. Note that $R_f(m+1)$ is of no use, but x provides a closed-form solution for fault location in 3 μs. When the fault current will start to settle down, i.e., $$\frac{di_1(t)}{dt}\bigg|_{t=t_1} = \frac{di_1(t)}{dt}\bigg|_{t=t_2} \approx 0$$

and $i_1(t_1) \approx i_1(t_2)$. In that case, both equations will have the same information, and the solutions will have the zero-determinant problem. So, it is important to use values during the transient state after a fault.

III. Validation of the Proposed Theory

To validate the theory developed in Section II, the circuit depicted in FIG. 1A is simulated in PSCAD with a sampling frequency of 1 MHz, meaning the sampled values are 1 μs apart. Rated system voltage is chosen to be 400 V, as it has been used in a number of papers for DC microgrids[20]-[24]. A 100 m long Yorkshire conductor[25] is chosen for the feeder. Circuit parameters are: r=1.37 mΩ/m, l=0.25 pH/m; $V_1$=400 V, $V_2$=395 V; $R_f$=0.01Ω; $I_0$=36.63 A. Fault resistance is taken as $R_f$=0.01Ω (low resistance) for this validation. Section V will show how the method can be extended to high-resistance faults.

Two faults are simulated at $x^{(1)}$=80 m and $x^{(2)}$=40 m distance from Bus 1. The fault inception time was set at $t_0$=0.1 s for both cases. Currents from Bus 1 to fault (iBus1$_{sim}$) for both cases are plotted in FIG. 2.

For $x^{(1)}$=80 m case, $L_1^{(1)}$=20 μH; $L_2^{(1)}$=5 μH; $R_1^{(1)}$=109.6 mΩ; and $R_2^{(1)}$=27.4 mΩ. So, $L_p^{(1)}=L_1^{(1)} \| L_2^{(1)}$=4 μH;

$$\lambda_L = \frac{R}{L} = 5480 s^{-1} \text{ and } \lambda_f^{(1)} = \frac{R_f}{L_p^{(1)}} = \frac{0.01 \Omega}{4\ \mu H} = 2500 s^{-1}.$$

To get the expression of current in form of Eq. 3, values of coefficients $K_1^{(1)}$ and $K_3^{(1)}$ are needed. A detailed calculation of the coefficients is provided in the supplementary material (Appendix B). From the calculated values, current $i_1^{(1)}(t)$ is $$i_1^{(1)}(t) = 2524.2843 - 2487.6497 e^{-7980 \cdot t}$$

However, since the fault in the circuit was simulated at $t_0$=0.1 s, $i_1^{(1)}(t)$ will be:

$$i_1^{(1)}(t) = 2524.2843 - 2487.6497 e^{-7980 \cdot (t-0.1)} \quad (14)$$

Figure 2A:
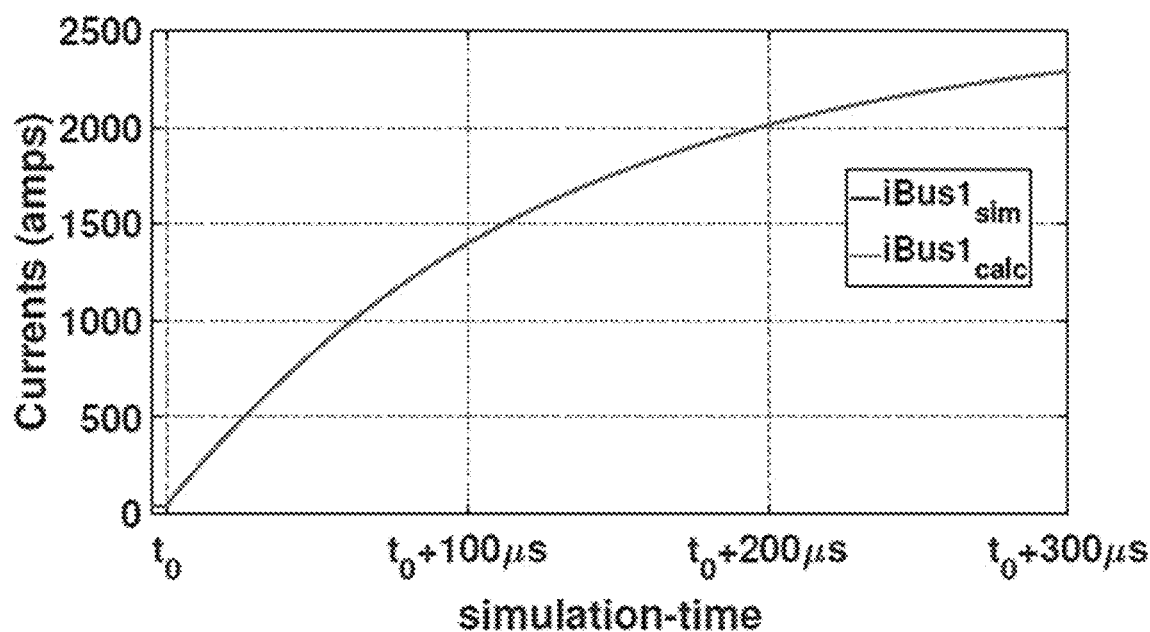
FIG. 2A is a presently disclosed exemplary graph of simulated and calculated currents from Bus 1 to fault for a fault at 80 m distance from Bus 1.
Figure 2B:
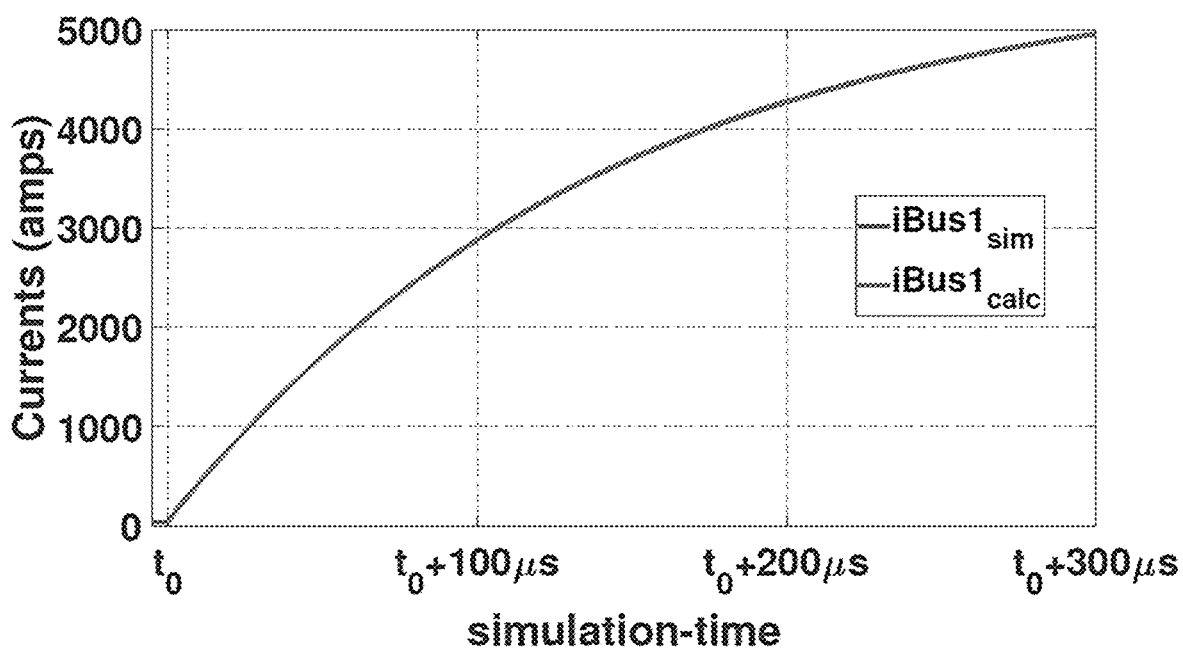
FIG. 2B is a presently disclosed exemplary graph of simulated and calculated currents from Bus 1 to fault for a fault at 40 m distance from Bus 1.

The calculated current using Eq. 14 is plotted in FIG. 2A as IBus1$_{calc}$, and are superimposed on the simulated current. Similarly, simulated and calculated currents for fault at $x^{(2)}$=40 m are plotted in FIG. 2B, which are also superimposed. This validates the theory of Section II-A.

To validate the method for fault location, measurements of three consecutive samples at three instances during the transient period after the fault initiation were made, and the fault distance was calculated using Eqs. 11 and 12 for each set of samples. In each case, the current derivative at a specific time-instant (say, $t_2$) was calculated using measurement at that time instant and the previous measurement, i.e., $$\frac{di_1(t_2)}{dt} = \frac{i_1(t_2) - i_1(t_1)}{t_2 - t_1}.$$

FIG. 10 comprising Table I, shows measured and calculated values at all three instances, for faults created at 80 m and 40 m from Bus 1. The calculated distance in each case is very close to the actual distance. The other variable being solved through Eqs. 11 and 12 is $R_f$ (m+1), which is of no interest to fault location. This result validates the closed-form deterministic theoretical formulation developed in Section II-B. So, it can be concluded that fault distance can be calculated, even in the presence of fault resistance, using local measurements only (in 3 μs), using the closed-form deterministic solution developed in Section II-B. This is claimed to be a seminal contribution of this work.

IV. Performance of the Method with Non-Ideal Sources

When a fault occurs on a feeder-section in a DC microgrid, the current contributions from the DC link capacitors associated with converters dominate the fault current first[4],[5]. As capacitors resist rapid change in voltage, for a short period of time after fault, the capacitor will act like a constant voltage DC source. Thus, measurements from this initial period can be used to determine the fault location modeled by Eqs. 11 and 12. This section describes the converter models, and fault detection and location on a feeder fed by converters.

A. LV DC Feeder Description

Figure 3:
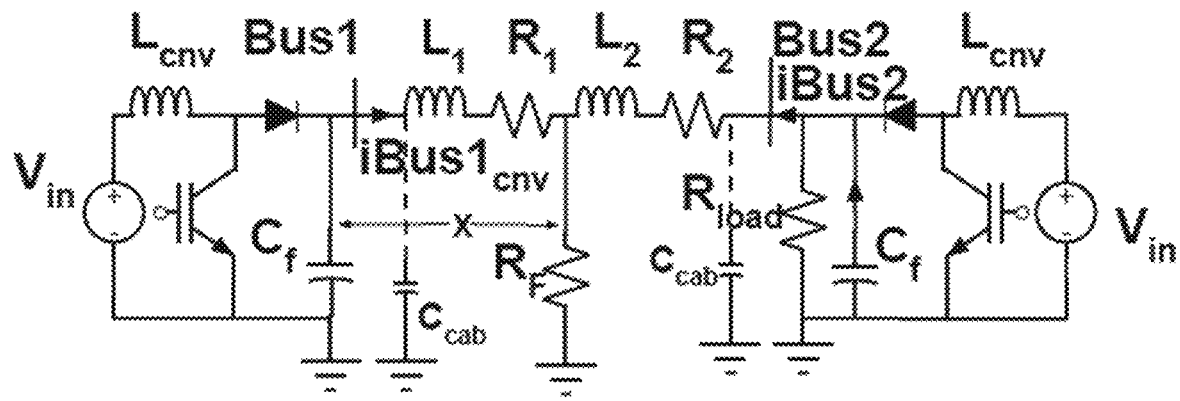
FIG. 3 is a representative schematic of a presently disclosed exemplary embodiment of a two bus DC microgrid, fed with converters.

FIG. 3 shows a two-bus DC microgrid with DC-DC boost converters connected to the buses instead of ideal voltage sources. Feeder parameters are the same as taken in Section III. Parameters of this test system are listed in FIG. 11 (Table II). Feeder parameters are taken from known literature[33] to match the ampacity of the 100-kW converter. As LVDC feeders are likely to be short in length, feeder capacitance was not considered in Section II-A while developing the theory. But, in practical cases, every cable is associated with some capacitance. So, the performance of the proposed method was verified with cable capacitance included in the simulation. Equivalent capacitance for the 100 m long cable was divided equally into two parts ($C_{cab}$ in FIG. 3), which were connected on each end of the feeder to form a pi-section. Since the purpose of this disclosure is to illustrate the performance of the fundamental theory developed in presence of converters, the most basic unipolar microgrid with T(earth)N(neutral) grounding scheme [26] is chosen, where the grid is unipolar and the neutral is solidly grounded[22],[27]. The protective device based on the proposed theory is placed only on the positive pole[22].

The DC-DC boost converter model is taken from published literature[28]. Converter parameters are chosen using typical values for a 100-kW converter and verified through a number of resources[11],[23],[29],[30]. It is assumed that the converter has an ideal DC voltage source at its low voltage side, representing a PV panel or a battery. This is justified since the method is implemented in microseconds, and the input voltage can be assumed to be constant during that time. This is also justified since the inductor at the input side of the converter ($L_{cnv}$) shown in FIG. 3, which is placed to filter out the ripple in the input DC current[37],[38], will oppose any sudden change in current. Within the time frame of a few microseconds after fault inception when the method is applied, any rapid change in the input current is restricted by this inductor, and the voltage across the input source, therefore, remains constant. This was tested by replacing the ideal DC input source in FIG. 3 with a practical input source comprised of a battery in parallel with an input capacitor, and the hypothesis was therefore validated. The duty cycle is kept fixed since the initial period after fault is governed by the natural response of an RLC circuit[4],[5],[20],[30], and the converter control would not activate during that time. Load current is 247 A, representing almost the full load in the system.

Figure 4:
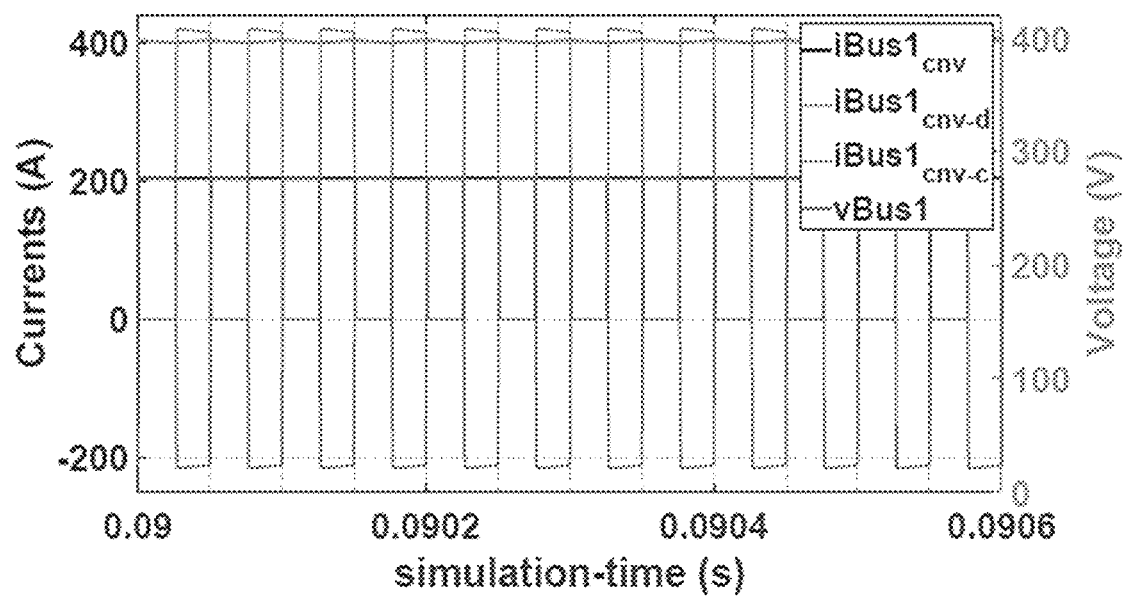
FIG. 4 is a presently disclosed exemplary graph of currents through different components in a converter under normal load condition.

B. Currents Under Normal Loading and Fault Conditions in Converter Interfaced Feeders FIG. 4 shows currents through diode (iBus1$_{cnv-d}$), through capacitor (iBus1$_{cnv-c}$), the summation of the two (total current iBus1$_{cnv}$), and the output voltage of the converter (vBus1) for the converter connected to Bus 1 in FIG. 3. It can be seen that the output current and voltage are practically constant throughout the time. The capacitor current and the diode current change depending on the switching of the IGBT.

Figure 5:
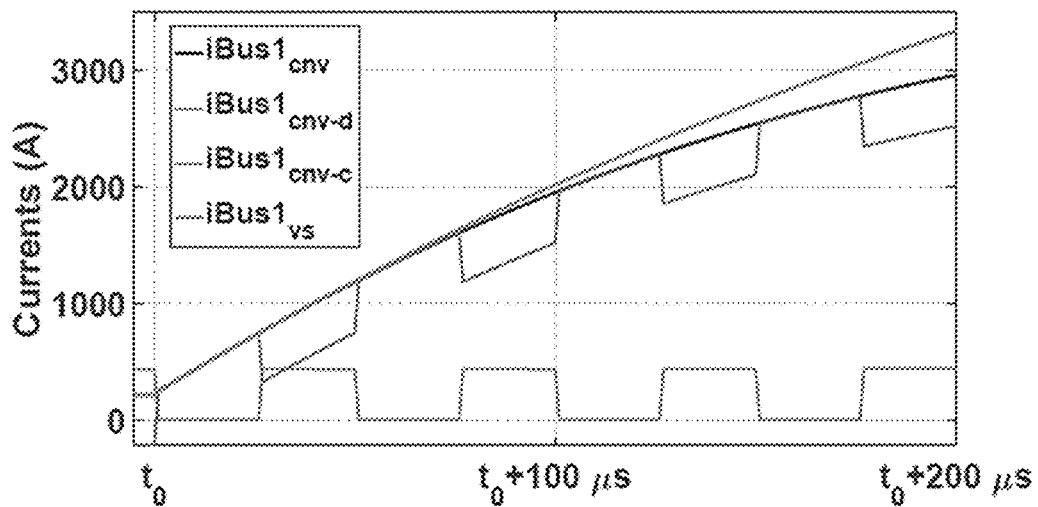
FIG. 5 is a presently disclosed exemplary comparison graph of fault currents sourced by an ideal source and a converter.

A fault was simulated in the DC feeder of FIG. 3 at 0.1 s with a fault resistance of $R_f=0.01\Omega$ at a distance x=80 m from Bus 1. The simulation was run for 0.2 s. FIG. 5 shows the currents through different components under this fault condition current through diode $iBus1_{cnv-d}$, current through capacitor $iBus1_{cnv-c}$, total current from Bus 1 to fault $iBus1_{cnv}$.

The same circuit then was simulated replacing the converters on the two buses with ideal DC sources. The voltages of the DC sources were set at the pre-fault voltages of Bus 1 and Bus 2 of the DC feeder with converters. The current from Bus 1 to fault from the circuit with the ideal DC source was plotted in FIG. 5 ($iBus1_{vs}$). Notice that total currents from Bus 1 to fault in both cases are practically equal to each other for much longer than 3 μs (equivalent to 3 samples here) after the fault initiation. Thus, Eqs. 11 and 12 can also be applied to DC feeders fed by converters.

C. Fault Detection and Fault Location

Detecting a fault is necessary before applying the proposed method to locate it. This Section shows how Eq. 13 can be used for fault detection as well. If voltage drop per unit length of line is denoted as vu(t), i.e., $$vu(t) = I * \frac{di_1(t)}{dt} + r * i_1(t),$$

Eq. 13 becomes $$x = \frac{\begin{vmatrix} v_1(t_1) & i_1(t_1) - I_0 \\ v_1(t_2) & i_1(t_2) - I_0 \end{vmatrix}}{\begin{vmatrix} v_u(t_1) & i_1(t_1) - I_0 \\ v_u(t_2) & i_1(t_2) - I_0 \end{vmatrix}} \quad (15)$$

Under normal loading condition, as seen in FIG. 4, the converter output voltage and current remain practically constant, i.e., $v_1(t_1) \approx v_1(t_2)$. Voltage drop across the unit length of line can also be assumed constant, i.e., $v_u(t_1) \approx v_u(t_2)$. So, $$x \approx \frac{\begin{vmatrix} v_1(t_1) & i_1(t_1) - I_0 \\ v_1(t_1) & i_1(t_2) - I_0 \end{vmatrix}}{\begin{vmatrix} v_u(t_1) & i_1(t_1) - I_0 \\ v_u(t_1) & i_1(t_2) - I_0 \end{vmatrix}} \quad (16)$$

$$\Rightarrow x \approx \frac{v_1(t_1) * (i_1(t_2) - i_1(t_1))}{v_u(t_1) * (i_1(t_2) - i_1(t_1))}$$

$$\Rightarrow x \approx \frac{v_1(t_1)}{v_u(t_1)}$$

But $v_1(t) = L_{line} * V_u(t) + v_2(t)$, where $L_{line}$ is the length of the line. So, $$x \approx \frac{L_{line} * v_u(t_1) + v_2(t_1)}{v_u(t_1)}$$

$$\Rightarrow x \approx L_{line} + \frac{v_2(t_1)}{v_u(t_1)}$$

Figure 6:
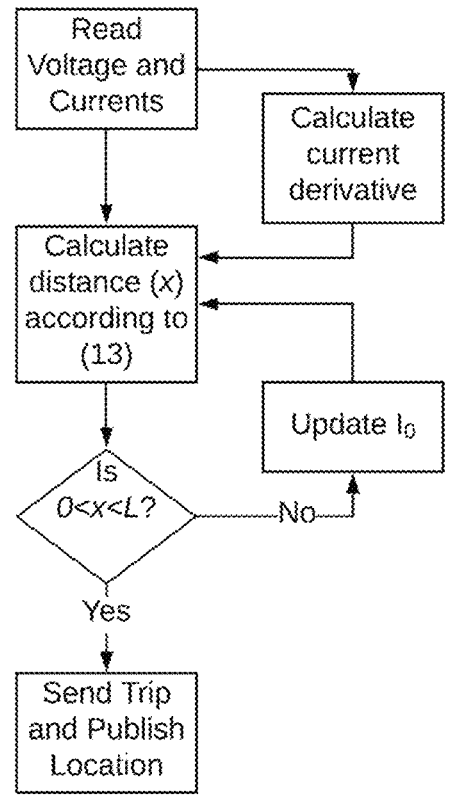
FIG. 6 is a representative flowchart of an exemplary presently disclosed embodiment for subject matter for detecting and locating fault(s)

Eq. 17 implies that under normal operation, the calculated length of fault point from Bus 1 will be larger than the line length. In case of Bus 2, the current in the line is flowing towards the bus. As a result, from the perspective of Bus 2, both the measured current $i_2(t)$ and the voltage drop per unit length of line, $v_u(t)$ are negative. So, from Eq. 16, x becomes a negative number under normal operating condition. Thus, under unfaulted condition, the distance measured will be either greater than the line length or negative. This can be used to distinguish pre-fault condition from fault condition, and hence, can detect a fault. Note that the pre-fault current has to be used with care in this approach. Since the load current can change over time, the pre-fault current should be updated with every new sample if no fault is detected. But, once a fault is detected, the pre-fault current should be fixed at its latest updated value during the fault location process. FIG. 6 shows the flowchart of the proposed fault detection and location.

D. Results

To implement methodology herewith, especially as represented by algorithm and flowchart information presently disclosed, one or more processors may be provided, programmed to perform the steps and functions called for by the algorithm and flowchart information, as will be understood by those of ordinary skill in the art.

Figure 7:
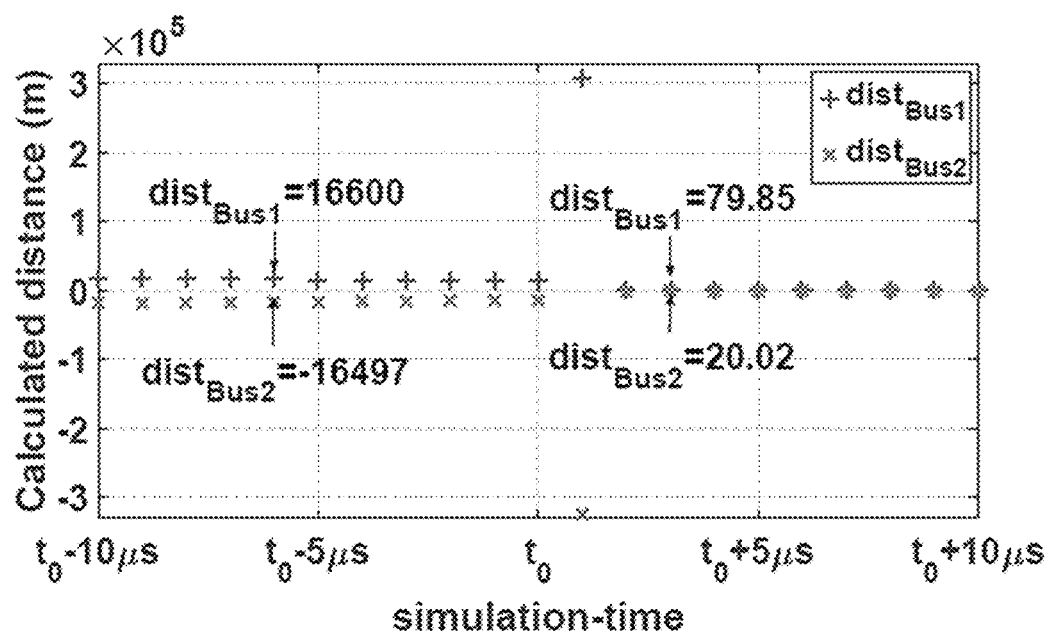
FIG. 7 is a presently disclosed exemplary graph of calculated distances to fault point from Bus 1 and Bus 2.

To evaluate the performance of the algorithm developed in Section IV-C, data were generated from the fault simulation described in Section IV-B with sampling frequency of 1 MHz. To implement the flowchart of FIG. 6, a moving window consisting of three samples was run through the accumulated data from the simulation to calculate the fault distance before and after the fault initiation. FIG. 7 shows the calculated distance of fault from Bus 1 ($dist_{Bus1}$) and Bus 2 ($dist_{Bus2}$) from 10 μs before fault inception to 10 μs after fault inception. Clearly, before fault inception the distance from Bus 1 is much larger than the line length, and the distance from Bus 2 is negative, as discussed in Section IV-C. Within 3 samples after the fault inception (at $t_0=0.1$ s), calculated distances become almost equal to the actual distances of the fault point on the line. Thus, both detection and location of fault are correctly and accurately performed simultaneously in 3 μs after inception of fault.

The accumulated data spanned from 40 μs before the fault inception to 80 μs after. From the 3rd sample after the fault inception time to the end of accumulated data, the calculated distances from Bus 1 varied from 79.8 m to 81.4 m. Thus, the proposed method provides accurate fault location over an extended range of data points after fault.

E. A Special Case

Clearly, the derivation of theory assumes DC sources present at both ends of the feeder. Since most of the DC loads and all non-ideal sources connect through converters, this is a reasonable assumption. A DC bus with only purely resistive load is therefore a rare case. However, it should be mentioned that under this unlikely scenario, one of the sources in FIG. 1A (e.g., $V_2$) will be replaced by a load resistance. This will drastically alter the nature of the current $i_2(t)$ during fault, and the value of m in Eq. 8 will no longer be constant. This means the two foundational Eq. 11 and Eq. 12 that require m to be a constant will no longer be valid, and the method will therefore fail.

It is important to mention here that the DC feeder analyzed here would typically be a part of a DC microgrid. This special case can occur only if such microgrid is single-sourced and there is no converter-based load in the microgrid. This is contrary to the very nature of microgrids, and therefore, this special case would be rare in practice.

V. Using the Method for High Resistance Faults

In order to use the method for high resistance faults, the impact of higher fault resistance on the fault-induced transient needs to be understood. From Eq. 3, fault current in a feeder fed by an ideal source is $$i_1(t) = K_1 + K_3 * e^{-(\lambda_L + \lambda_f)t} \quad (18)$$

$$\Rightarrow i_1(t) = K_1 + K_3 * e^{-\left(\frac{R}{L} + \frac{R_f}{L_p}\right)t}$$

$$\Rightarrow i_1(t) = K_1 + K_3 * e^{-\left(\frac{1}{\tau_L} + \frac{1}{\tau_f}\right)t}$$

$$\Rightarrow i_1(t) = K_1 + K_3 * e^{-\frac{t}{\tau_T}}$$

where, $\tau_T$ is the equivalent time constant, and $$\frac{1}{\tau_T} = \frac{1}{\tau_L} + \frac{1}{\tau_f} \quad (19)$$

Also, $\tau_L = L/R =$ time constant of line, and $$\tau_f = \frac{L_p}{R_f} = \frac{L_1 \| L_2}{R_f} = \text{time constant of fault.}$$

Figure 8:
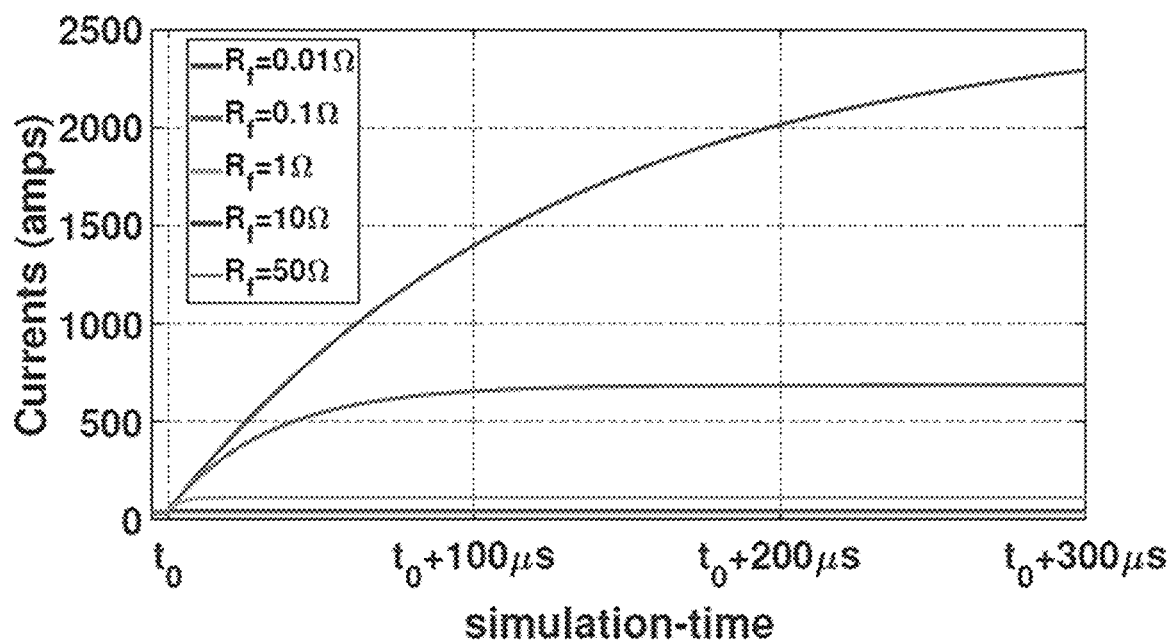
FIG. 8 is a presently disclosed exemplary graph of current from Bus 1 to fault with varying fault resistance with ideal voltage source.

From Eq. 19, $\tau_T$ is smaller than both $\tau_L$ and $\tau_f$. The smaller the value of $\tau_T$, shorter the time the transient will last. Therefore, as the value of $R_f$ increases, the transient period will be shorter. FIG. 8 shows simulated currents from the circuit of FIG. 1A, with varying fault resistances to verify this argument. In addition, the shorter transient also gets steeper, increasing the chances of erroneous calculation of di/dt. Therefore, to accurately determine location with high resistance faults, sampling frequency needs to be increased, so the required samples with adequate sampling rate for accurate calculation of di/dt can be obtained before the transient subsides.

According to the IEEE Power System Relaying Committee report[31], a fault is considered a high impedance fault if it results in currents comparable to load currents, not detectable by traditional overcurrent relays or fuses. Based on the converter rating of 400 V, 100 kW, the corresponding load current and load resistance are 250 A and 1.6Ω, respectively. Therefore, any fault with resistance 1.6Ω or higher is considered a high resistance fault for this system.

Figure 9A:
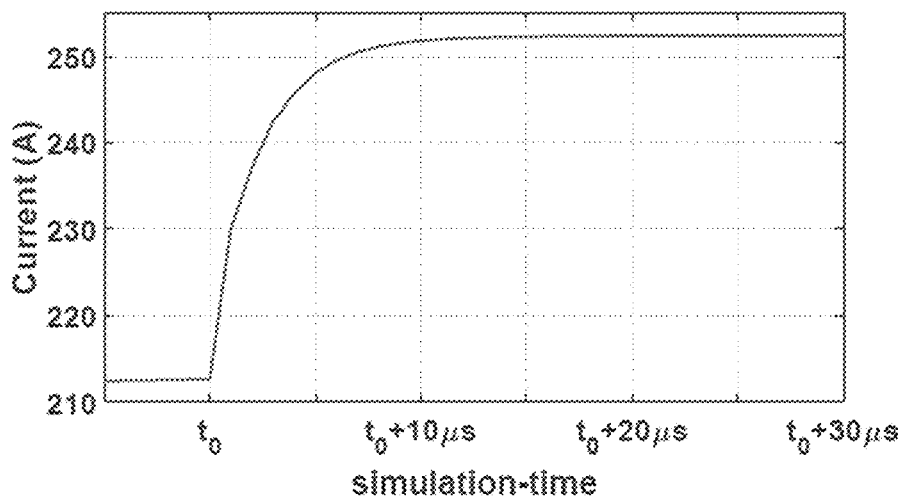
FIG. 9A is a presently disclosed exemplary graph of results of current from high resistance (Rf=2Ω) fault simulated at 80 m from Bus 1.

A fault is simulated in the system described in Section IV-A with $R_f = 2\Omega$, at fault inception time $t_0 = 0.1$ s, at a distance of 80 m from Bus 1. From the manufacturer's data sheet of the chosen 185 sq mm conductor[33], $\tau_L \approx 2955.6$ µs and $\tau_f \approx 2.3432$ µs. According to Eq. 19, $\tau_T \approx 2.34$ µs. According to the literature[32], the transient will settle down approximately within $5\tau_T = 11.71$ µs after the fault inception. The current plot in FIG. 9A from the simulation supports the argument.

Figure 9B:
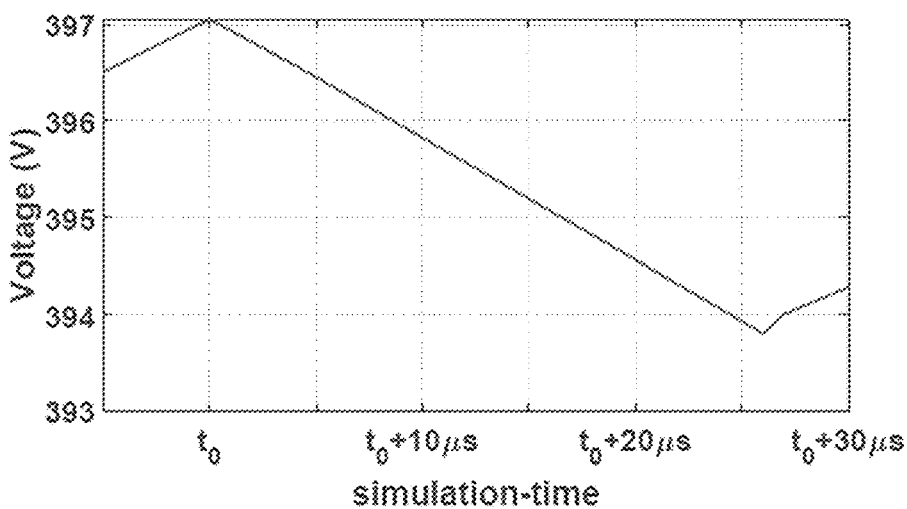
FIG. 9B is a presently disclosed exemplary graph of results of capacitor (source) voltage from high resistance (Rf=2Ω) fault simulated at 80 m from Bus 1.

Observe from the voltage plot of FIG. 9B that the change in the capacitor voltage before the current settles to steady state is less than 0.82% of the initial voltage. This phenomenon is characteristic of high resistance faults. Because of low fault currents and fast transients, capacitors do not lose much charge and the voltage remains practically constant. Thus, the proposed theory, developed with ideal voltage sources, can be used to determine fault location for high resistance faults.

Figure 9C:
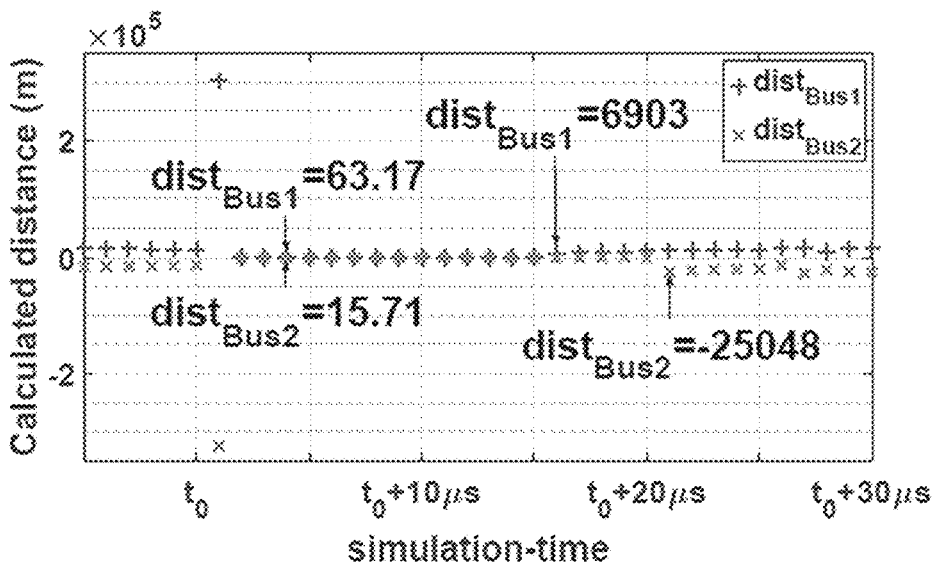
FIG. 9C is a presently disclosed exemplary graph of results of calculated distance of fault point from Bus 1 and Bus 2 for a high resistance (Rf=2Ω) fault simulated at 80 m from Bus 1.

FIG. 9C shows the plot of the calculated distance to the fault point from Bus 1 for this high resistance fault simulated at 1 MHz sampling rate. With this sampling rate, it is expected that the method will provide fault location for up to approximately 10 samples after fault inception. FIG. 9C shows that the method provides rational (though incorrect) answers for approximately 15 µs after fault inception. Then, the calculations are affected due to the determinant in Eq. 14 getting close to zero in steady state.

Clearly, there is a significant error in fault location. This is because errors are introduced in the calculation of di/dt due to the much steeper exponential transient. To minimize this error, a higher sampling frequency is required. FIG. 13 (Table IV) confirms this rationale. Conversely, it can be argued that lower sampling rates would suffice for faults with low fault resistances. In the fault simulation case with $R_f = 0.01\Omega$ in Section IV-B, data were sampled at 1 MHz frequency. The same circuit was simulated and sampled at lower frequencies and the proposed algorithm was implemented for the same amount of time to check the performance of this method at lower frequencies. FIG. 14 (Table V) shows the results. Data points from lower sampling frequency cases result in higher error, but even with 100 kHz sampling frequency, the error is less than 5%. These results illustrate that as long as the sampling frequency is adequate, the proposed method provides accurate results regardless of fault resistance.

To further investigate the performance of the method for high resistance faults, faults with resistances ranging from 0.01Ω to 100Ω were simulated. FIG. 12 (Table III) lists the sampling frequencies required to get the fault location error within ±1.5%. These results illustrate that as long as the sampling frequency is adequate, the proposed method provides accurate results, regardless of fault resistance. The state-of-the-art oscilloscopes have probes that can sample up to 100 GHz[19], which would enable the method to work for higher fault resistance values as well.

It should be mentioned that all the faults considered were purely resistive. In AC distribution systems, High Impedance Fault (HIF) has a complex model with non-linear elements like diodes and variable resistors, to capture the results obtained by staged faults[39]. This model represents the arcing that almost always accompanies such faults, which, depending on the ground-surface in the fault path, changes significantly, producing different amounts of heat, making the fault resistance change randomly. Such models have not been developed for faults on low voltage DC circuits, and hence out of scope of this disclosure.

VI. Sensitivity Analysis

A. Fault Distance

As $$\tau_f = \frac{L_p}{R_f} = \frac{L_1 \| L_2}{R_f}$$

the less $L_1$ or $L_2$ will be, the less $L_p$ will become, which will eventually result in lower $\tau_f$. So, if the fault is very close to or very far from the bus, $\tau_f$ will be smaller, and according to the trend seen in Section V, errors will be higher, potentially requiring higher sampling frequency. To examine the sensitivity of the method to fault distance, several simulations were performed with varying fault distances and $R_f = 0.01\Omega$ in the system of FIG. 3. Then, sampling frequency was varied to examine the impact on the location error. Results are tabulated in FIG. 15 (Table VI) and support the argument. Notice that with 1 MHz sampling frequency, the error is quite low for all fault locations, indicating low sensitivity to fault distance and thus, there may not be any need assumed sampling frequency.

B. DC Link Capacitor Size

The proposed fault location method is accurate because the DC link capacitor behaves like an ideal DC source for a short duration after the initiation of a fault; however, the time duration for which the response of the capacitor can be treated as the response of an ideal DC source is dependent on the size of the capacitor. Given the fault resistance, line parameters, and fault distance is fixed, this duration gets larger if the capacitor size (in Farad) gets larger. With the advancement in power electronics and high-speed switching devices, the capacitor size used at the output of converters is getting reduced since the high-speed switching devices can support higher switching frequency. Thus, it is important to check how the method performs with lower values of DC link capacitance.

A general approach to calculating the size of the output capacitor of a DC-DC boost converter is to use the concept of charge balance. According to this concept, during steady state, the average change of the stored charge and, hence, the average change in the capacitor voltage will be zero over a switching period. From Eq. 20, which can be derived from prior publications[30,38], the minimum capacitance C required to restrict the ripple at the converter output within $\Delta v_{max}$ can be obtained.

$$C \geq \frac{IT_s}{8\Delta v_{max}} \quad (20)$$

Here, $2\Delta v_{max}$=ripple voltage (peak-to-peak), I=average inductor current, C=DC-link capacitor value, and $T_s$=switching-period.

Several simulations were performed in the circuit of FIG. 3, adjusting the DC-link capacitor size and the switching frequency according to Eq. 20. Location error was calculated for $R_f$=0.01Ω and $R_f$=0.1Ω. FIG. 16 (Table VII) shows the results. It can be seen that even with a very low capacitor size (associated with very high switching frequency), the method performs well.

VII. Conclusion

This disclosure develops a deterministic closed-form mathematical model based on the time-domain physical model of a faulted DC feeder. It is shown that as long as the sampling frequency is high enough to enable accurate calculation of the current derivative (di/dt), the single-ended fault detection and location method derived from this model is immune to fault resistance. This overcomes a well-known hurdle encountered in all single-ended fault location methods proposed in literature. The method is shown to work even when the feeder is fed by converter-based practical DC sources. The detection and location happen simultaneously in 3 samples after inception of fault, which translates to 3 µs for a sampling rate of 1 MHz. This assures the safety of circuit breakers as well as converters. The method works well even for high resistance faults, if the sampling frequency can be increased, a condition that is not unreasonable with the technology available today, as oscilloscopes in the market[19] support sampling frequency of up to 100 GHz. Since the purpose of this disclosure is to disseminate the seminal theory that enables this application, a single DC feeder is simulated for validation. Future work will be focused on extending the application to build a coordinated protection scheme for an entire DC microgrid.

Moreover, this disclosure reports the discovery of the mathematical foundations and implementation of a fast fault location method for a DC feeder that is independent of the topology of the system built around the feeder. This opens the doors for a communication-free topology-independent protection scheme for an entire DC microgrid. Such a scheme could use the presently disclosed method as a time-domain distance relay, placed on each side of every feeder of a DC microgrid. It could also be possible to adapt the performance of the presently disclosed method for different grounding schemes in a DC microgrid. Further research can be performed to include feeder capacitance in the formulation to adapt the method for HVDC lines fed by voltage source converters (VSCs).

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

REFERENCES

[1] H. Kakigano, Y. Miura, and T. Ise, "Low-voltage bipolar-type DC microgrid for super high quality distribution," IEEE Transactions on Power Electronics, vol. 25, no. 12, pp. 3066-3075, 2010.

[2] L. Kong, H. Nian, Q. Huang, Z. Zhang, J. Xu, and K. Dai, "Optimization of current breaker and fault current limiter in DC micro-grid based on faulty transient analysis," in 2018 21st International Conference on Electrical Machines and Systems (ICEMS), 2018, pp. 2017-2022.

[3] A. Meghwani, S. C. Srivastava, and S. Chakrabarti, "Local measurement based technique for estimating fault location in multi-source DC microgrids," IET Generation, Transmission Distribution, vol. 12, no. 13, pp. 3305-3313, 2018.

[4], "A non-unit protection scheme for DC microgrid based on local measurements," IEEE Transactions on Power Delivery, vol. 32, no. 1, pp. 172-181, 2017.

[5] A. Ukil, Y. M. Yeap, and K. Satpathi, Fault Analysis and Protection System Design for DC Grids, 1st ed. Singapore: Springer Nature Singapore Pte Ltd, 2020.

[6] R. Bhargav, B. R. Bhalja, and C. P. Gupta, "Novel fault detection and localization algorithm for low-voltage DC microgrid," IEEE Transactions on Industrial Informatics, vol. 16, no. 7, pp. 4498-4511, 2020.

[7] C. Noh, C. Kim, G. Gwon, and Y. Oh, "Development of fault section identification technique for low voltage DC distribution systems by using capacitive discharge current," Journal of Modern Power Systems and Clean Energy, vol. 6, no. 3, pp. 509-520, 2018.

[8] C. Yuan, M. A. Haj-ahmed, and M. S. Illindala, "Protection strategies for medium-voltage direct-current microgrid at a remote area mine site," IEEE Transactions on Industry Applications, vol. 51, no. 4, pp. 2846-2853, 2015.

[9] M. Monadi, C. Gavriluta, A. Luna, J. I. Candela, and P. Rodriguez, "Centralized protection strategy for medium voltage DC microgrids," IEEE Transactions on Power Delivery, vol. 32, no. 1, pp. 430-440, 2017.

[10] A. Meghwani, S. C. Srivastava, and S. Chakrabarti, "A new protection scheme for DC microgrid using line current derivative," in 2015 IEEE Power Energy Society General Meeting, 2015, pp. 1-5.

[11] A. Meghwani, S. Chakrabarti, and S. C. Srivastava, "An on-line fault location technique for DC microgrid using transient measurements," in 2017 7th International Conference on Power Systems (ICPS), 2017, pp. 386-391.

[12] R. Mohanty, U. S. M. Balaji, and A. K. Pradhan, "An accurate noniterative fault-location technique for low-voltage DC microgrid," IEEE Transactions on Power Delivery, vol. 31, no. 2, pp. 475-481, 2016.

[13] A. K. Pradhan and R. Mohanty, "Cable fault location in a DC microgrid using current injection technique," in 2016 National Power Systems Conference (NPSC), 2016, pp. 1-6.

[14] O. M. K. K. Nanayakkara, A. D. Rajapakse, and R. WAChal, "Traveling wave-based line fault location in star-connected multiterminal hvDC systems," IEEE Transactions on Power Delivery, vol. 27, no. 4, pp. 2286-2294, 2012.

[15] S. Azizi, M. Sanaye-Pasand, M. Abedini, and A. Hasani, "A traveling wave-based methodology for wide-area fault location in multiterminal DC systems," IEEE Transactions on Power Delivery, vol. 29, no. 6, pp. 2552-2560, 2014.

[16] S. Beheshtaein, R. M. Cuzner, M. Forouzesh, M. Savaghebi, and J. M. Guerrero, "DC microgrid protection: A comprehensive review," IEEE Journal of Emerging and Selected Topics in Power Electronics, pp. 1-1, 2019.

[17] Q. Yang, J. $L_1$, S. Le Blond, and C. Wang, "Artificial neural network based fault detection and fault location in the DC microgrid," Energy Procedia, vol. 103, pp. 129-134, 2016, renewable Energy Integration with Mini/Microgrid—Proceedings of REM2016. [Online]. Available: http://www.sciencedirect.com/science/article/pii/S1876610216314710

[18] SEL-T400L Time-Domain Line Protection, SEL, Accessed Feb. 14, 2021 [pdf]. [Online]. Available: https://cms-cdn.selinc.com/assets/Literature/Product %20Literature/Data %20Sheets/T400L DS 20190430.pdf?v=20190508-132121

[19] Digital and Mixed Signal Oscilloscopes, Tektronix, Accessed Jan. 28, 2021 [pdf]. [Online]. Available: https://www.tek.com/datasheet/digital-and-mixed-signal-oscilloscopes

[20] S. D. A. Fletcher, P. J. Norman, S. J. Galloway, P. Crolla, and G. M. Burt, "Optimizing the roles of unit and non-unit protection methods within DC microgrids," IEEE Transactions on Smart Grid, vol. 3, no. 4, pp. 2079-2087, December 2012.

[21] S. D. A. Fletcher, P. J. Norman, K. Fong, S. J. Galloway, and G. M. Burt, "High-speed differential protection for smart DC distribution systems," IEEE Transactions on Smart Grid, vol. 5, no. 5, pp. 2610-2617, 2014.

[22] M. Mobarrez, D. Fregosi, S. BhattACharya, and M. A. Bahmani, "Grounding architectures for enabling ground fault ride-through capability in DC microgrids," in 2017 IEEE Second International Conference on DC Microgrids (ICDCM), 2017, pp. 81-87.

[23] D. Salomonsson, L. Soder, and A. Sannino, "Protection of low-voltage DC microgrids," IEEE Transactions on Power Delivery, vol. 24, no. 3, pp. 1045-1053, 2009.

[24] Y. Reddy O, S. Chatterjee, A. K. Chakraborty, and A. R. Bhowmik, "Fault detection and location estimation for lvDC microgrid using self parametric measurements," International Transactions on Electrical Energy Systems, vol. n/a, no. n/a, p. e12499. [Online]. Available: https://onlinelibrary.wiley.com/doi/abs/10.1002/2050-7038.12499

[25] Service Cable Products, Nexans Energy, Accessed Feb. 3, 2020 [pdf]. [Online]. Available: https://drive.google.com/file/d/1qBrt1anpfkmlp7ashlYUGqg5kBVu2BP/view?usp=sharing

[26] S. Augustine, J. E. Quiroz, M. J. Reno, and S. Brahma, "DC microgrid protection: Review and challenges," Sandia National Laboratories, New Mexico, USA, Tech. Rep. SAND2018-8853, August 2018.

[27] T. R. de Oliveira, A. S. Bolzon, and P. F. Donoso-Garcia, "Grounding and safety considerations for residential DC microgrids," in IECON 2014-40th Annual Conference of the IEEE Industrial Electronics Society, 2014, pp. 5526-5532.

[28] G. M. Masters, Renewable and Efficient Electric Power Systems, 2nd ed. Hoboken, New Jersey: John Wiley & Sons, 2013, ch. 3, sec. 9.2, p. 174.

[29] T. Kaipia, P. Nuutinen, A. Pinomaa, A. Lana, J. Partanen, J. Lohjala, and M. Matikainen, "Field test environment for lvDC distribution—implementation experiences," in CIRED 2012 Workshop: Integration of Renewables into the Distribution Grid, 2012, pp. 1-4.

[30] S. D. A. Fletcher, P. J. Norman, S. J. Galloway, and G. M. Burt, "Determination of protection system requirements for DC unmanned aerial vehicle electrical power networks for enhanced capability and survivability," IET Electrical Systems in Transportation, vol. 1, no. 4, pp. 137-147, 2011.

[31] "High impedance fault detection technology," PSRC Working Group D15, Tech. Rep., Accessed Aug. 23, 2020 [pdf]. [Online]. Available: https://www.pes-psrc.org/kb/published/reports/High Impedance Fault Detection Technology.pdf

[32] J. W. Nilsson and S. A. Riedel, Electric Circuits, 9th ed. One Lake Street, Upper Saddle River, New Jersey: Prentice Hall, 2011, ch. 7, sec. 7.1, p. 217.

[33] LT/HT Power & Control Cables, HAVELLS, Accessed Jun. 5, 2021[pdf]. [Online]. Available:https://www.havells.com/content/dam/havells/brouchers/industrial%20Cable/Cable %2 0Catalogue-2016.pdf[25]

[34] X. Feng, L. Qi, and J. Pan, "A novel fault location method and algorithm for DC distribution protection," IEEE Transactions on Industry Applications, vol. 53, no. 3, pp. 1834-1840, 2017.

[35] J. E. Hill, S. D. Fletcher, P. J. Norman, and S. J. Galloway, "Protection system for an electrical power network," Sep. 23 2014, U.S. Pat. No. 8,842,401.

[36] J.-D. Park, "Fault detection, isolation, location and reconnection systems and methods," Apr. 14 2015, U.S. Pat. No. 9,007,735.

[37] B. Hauke, "Basic calculation of a boost converter's power stage," Texas Instruments, Texas, USA, Tech. Rep. SLVA372C, November 2009. [Online]. Available: https://www.t$_1$.com/lit/an/siva372c/siva372c.pdf?ts=1642440495717

[38] R. W. Erickson and D. Maksimovic, Fundamentals of power electronics, 3rd ed. Springer International Publishing AG, 2020.

[39] S. Gautam and S. M. Brahma, "Detection of high impedance fault in power distribution systems using mathematical morphology," IEEE Transactions on Power Systems, vol. 28, no. 2, pp. 1226-1234, 2013.

Appendix A

Detailed Proof of Fault Current Expression in DC Microgrids With Ideal Voltages Sources

Step-Wise Derivation of (3) and (4)

Applying KVL in loop 1 of FIG. 1B, the following can be obtained $$-V_1/s - L_1 I_0 + (s*L_1 + R_1)I_1 + R_f(I_1 + I_2) = 0 \Rightarrow (sL_1 + R_1 + R_f)I_1 + R_f I_2 = V_1/s + L_1 I_0 \Rightarrow (s^2 L_1 + s(R_1 + R_f))I_1 + sR_f I_2 = V_1 + sL_1 I_0 \quad (1)$$

Similarly in loop 2, $$-V_2/s + L_2 I_0 + (sL_2 + R_2)I_2 + R_f(I_2 + I_1) = 0 \Rightarrow R_f I_1 + (sL_2 + R_2 + R_f)I_2 = V_2/s - L_2 I_0 \Rightarrow sR_f I_1 + (s^2 L_2 + s(R_2 + R_f))I_2 = V_2 - sL_2 I_0 \quad (2)$$

From (1) and (2) we can get $$I_1 = \frac{\Delta_1}{\Delta}; I_2 = \frac{\Delta_2}{\Delta} \quad (A.1)$$

where, $$\Delta = \begin{vmatrix} s^2 L_1 + s(R_1 + R_f) & sR_f \\ sR_f & s^2 L_2 + s(R_2 + R_f) \end{vmatrix} \quad (A.2)$$

$$\Delta = s^2 \left[ (sL_1 + (R_1 + R_f))(sL_2 + (R_2 + R_f)) - R_f^2 \right]$$

$$\Delta = s^2 \left[ s^2 L_1 L_2 + s*(L_1(R_2 + R_f) + L_2(R_1 + R_f)) + (R_1 + R_f)(R_2 + R_f) - R_f^2 \right]$$

$$\Delta = s^2 \left[ s^2 L_1 L_2 + s*(L_1(R_2 + R_f) + L_2(R_1 + R_f)) + R_1 R_2 + R_1 R_f + R_2 R_f \right]$$

and, $$\Delta_1 = \begin{vmatrix} V_1 + sL_1 I_0 & sR_f \\ V_2 + sL_2 I_0 & s^2 L_2 + s(R_2 + R_f) \end{vmatrix} \quad (A.3)$$

$$\Delta_1 = s[(V_1 + sL_1 I_0)(sL_2 + (R_2 + R_f)) - R_f(V_2 - sL_2 I_0)]$$

and, $$\Delta_2 = \begin{vmatrix} s^2 L_1 + s(R_1 + R_f) & V_1 + sL_1 I_0 \\ sR_f & V_2 + sL_2 I_0 \end{vmatrix} \quad (A.4)$$

$$\Delta_2 = s[(V_2 - sL_2 I_0)(sL_1 + (R_1 + R_f)) - R_f(V_1 + sL_1 I_0)]$$

Putting the values of $\Delta_1$ and $\Delta$ in (A.1), $I_1$ can be expressed as $$I_1 = \frac{(V_1 + sL_1 I_0)(sL_2 + (R_2 + R_f)) - R_f(V_2 - sL_2 I_0)}{s\left[(L_1 L_2)s^2 + (L_1(R_2 + R_f) + L_2(R_1 + R_f))s + (R_1 R_2 + R_1 R_f + R_2 R_f)\right]} \quad (A.5)$$

$$I_1 = \frac{(V_1 + sL_1 I_0)(sL_2 + (R_2 + R_f)) - R_f(V_2 - sL_2 I_0)}{(L_1 L_2)*s\left[s^2 + \frac{(L_1(R_2 + R_f) + L_2(R_1 + R_f))}{L_1 L_2}s + \frac{(R_1 R_2 + R_1 R_f + R_2 R_f)}{L_1 L_2}\right]}$$

Let's say the denominator of (A.5) is $(L_1 L_2)*s(as^2 + bs + c)$ where $$a = 1 \quad (A.6)$$

$$b = \frac{L_1(R_2 + R_f) + L_2(R_1 + R_f)}{L_1 L_2}$$

Roots of $as^2 + bs + c = 0$ are $$r_1, r_2 = \frac{-b \pm \sqrt{b^2 - 4ac}}{2a} \quad (A.7)$$

$$r_1, r_2 = 1/2 * \left(-b/a \pm \sqrt{(b/a)^2 - 4(c/a)}\right)$$

Now, $$\frac{b}{a} = \frac{L_1(R_2 + R_f) + L_2(R_1 + R_f)}{L_1 L_2} \quad (A.8)$$

$$\frac{b}{a} = \frac{R_2 + R_f}{L_2} + \frac{R_1 + R_f}{L_1}$$

$$\frac{b}{a} = \frac{R_2}{L_2} + \frac{R_f}{L_2} + \frac{R_1}{L_1} + \frac{R_f}{L_1}$$

$$\frac{b}{a} = \frac{R_1}{L_1} + \frac{R_2}{L_2} + R_f\left(\frac{1}{L_1} + \frac{1}{L_2}\right)$$

$$\frac{b}{a} = \frac{R_1}{L_1} + \frac{R_2}{L_2} + \frac{R_f}{L_p}$$

where, $1/L_p = 1/L_1 + 1/L_2$, parallel equivalent inductance of $L_1, L_2$

But, $R_1/L_1 = R_2/L_2 = 1/\tau_L = \lambda_L$, where $\tau_L$ = time constant of line. Let's say $\lambda_f = 1/\tau_f = R_f/L_p$ So, from (A.8), $$\frac{b}{a} = \lambda_L + \lambda_L + \lambda_f \quad (A.9)$$

$$\frac{b}{a} = 2\lambda_L + \lambda_f$$

Now, $$4\left(\frac{c}{a}\right) = 4*\left(\frac{R_1 R_2 + R_1 R_f + R_2 R_f}{L_1 L_2}\right) \quad (A.10)$$

$$4\left(\frac{c}{a}\right) = 4*\left[\frac{R_1 R_2}{L_1 L_2} + \frac{(R_1 + R_2)R_f}{L_1 L_2}\right]$$

$$4\left(\frac{c}{a}\right) = 4*\left[\lambda_L^2 + \frac{(R_1 + R_2)R_f}{(L_1 + L_2)L_1 L_2}\right]$$

$$4\left(\frac{c}{a}\right) = 4*\left[\lambda_L^2 + \frac{RR_f}{LL_p}\right]$$

$$4\left(\frac{c}{a}\right) = 4*\left[\lambda_L^2 + \lambda_L * \lambda_f\right]$$

Now, $$\sqrt{\left(\frac{b}{a}\right)^2 - 4\left(\frac{c}{a}\right)} \quad (A.11)$$

$$= \sqrt{(2\lambda_L + \lambda_f)^2 - 4[\lambda_L^2 + \lambda_L * \lambda_f]}$$

$$= \sqrt{4\lambda_L^2 + 4\lambda_L \lambda_f + \lambda_f^2 - 4\lambda_L^2 - 4\lambda_L \lambda_f}$$

$$= \sqrt{\lambda_f^2}$$

$$= \lambda_f$$

Now, roots from (A.5)

$$r_1, r_2 = \frac{1}{2} * [-(2\lambda_L + \lambda_f) \pm \lambda_f] \quad (A.12)$$

$$r_1 = -\lambda_L; r_2 = -(\lambda_L + \lambda_f)$$

If (A.5) is expanded through partial fraction expansion and subsequent inverse Laplace transform is done on that, the current expressions will get the following forms.

$$I_1(s) = \frac{K_1}{s-0} + \frac{K_2}{s-r_1} + \frac{K_3}{s-r_2} \quad (A.13)$$

and, $$i_1(t) = K_1 + K_2 * e^{-\lambda_L t} + K_3 * e^{-(\lambda_L + \lambda_f)t} \quad (A.14)$$

It can be shown that, in (A.14) the coefficient $K_2=0$. The coefficient $K_2$ will be $$K_2 = (s + \lambda_L)I_1(s)|_{s=-\lambda_L} \quad (A.15)$$

$$K_2 = (s + \lambda_L)\frac{(V_1 + sL_1I_0)(sL_2 + (R_2 + R_f)) - R_f(V_2 - sL_2I_0)}{s[(L_1L_2)s^2 + (L_1(R_2 + R_f) + L_2(R_1 + R_f))s + (R_1R_2 + R_1R_f + R_2R_f)]}\bigg|_{s=-\lambda_L}$$

$$K_2 = (s + \lambda_L)\frac{(V_1 + sL_1I_0)(sL_2 + (R_2 + R_f)) - R_f(V_2 - sL_2I_0)}{(L_1L_2) * s(s + \lambda_L)(s + \lambda_L + \lambda_f)}\bigg|_{s=-\lambda_L}$$

$$K_2 = \frac{(V_1 + sL_1I_0)(sL_2 + (R_2 + R_f)) - R_f(V_2 - sL_2I_0)}{(L_1L_2) * s(s + \lambda_L + \lambda_f)}\bigg|_{s=-\lambda_L}$$

Numerator of (A.15) can be reorganized as follows $$=(V_1+sL_1I_0)(sL_2+(R_2+R_f))-R_f(V_2-sL_2I_0)=sL_2V_1+$$
$$V_1R_2+V_1R_f+s^2L_1L_2I_0+sL_1R_2I_0+sL_1R_fI_0-R_fV_2+$$
$$sL_2R_fI_0=s^2L_1L_2I_0+s(L_2V_1+L_1R_2I_0+L_1R_fI_0+$$
$$L_2R_fI_0)+V_1R_2+R_f(V_1-V_2)=s^2L_1L_2I_0+sL_2V_1+sI_0$$
$$(L_1R_2+L_1R_f+L_2R_f)+V_1R_2+R_f(V_1-V_2)=s^2L_1L_2I_0+$$
$$sL_2V_1+sI_0(L_1R_2+(L_1+L_2)R_f)+V_1R_2+R_f(V_1-$$
$$V_2)=s^2L_1L_2I_0+sL_2V_1+sI_0(L_1R_2+LR_f)+V_1R_2+R_f$$
$$(V_1-V_2)=s^2L_1L_2I_0+sL_2V_1+sL_1R_2I_0+sL_1R_fI_0+$$
$$V_1R_2+R_f(V_1-V_2) \quad (A.16)$$

From the prefault circuit $I_0=(V_1-V_2)/R$, so the numerator comes $$= s^2L_1L_2\left(\frac{V_1-V_2}{R}\right) + sL_2V_1 + \quad (A.17)$$

$$sL_1R_2\left(\frac{V_1-V_2}{R}\right) + sLR_f\left(\frac{V_1-V_2}{R}\right) + V_1R_2 + R_f(V_1-V_2)$$

When evaluated at $s=-\lambda_L$, the numerator becomes $$= (-\lambda_L)^2 L_1L_2\left(\frac{V_1-V_2}{R}\right) + (-\lambda_L)L_2V_1 + \quad (A.18)$$

$$(-\lambda_L)L_1\left(R_2\left(\frac{V_1-V_2}{R}\right)\right) + (-\lambda_L)LR_f\left(\frac{V_1-V_2}{R}\right) + V_1R_2 + R_f(V_1-V_2)$$

$$= \left(-\frac{R}{L}\right)^2 L_1L_2\left(\frac{V_1-V_2}{R}\right) + \left(-\frac{R}{L}\right)L_2V_1 +$$

$$\left(-\frac{R}{L}\right)L_1R_2\left(\frac{V_1-V_2}{R}\right) + \left(-\frac{R}{L}\right)LR_f\left(\frac{V_1-V_2}{R}\right) + V_1R_2 + R_f(V_1-V_2)$$

$$= \frac{RL_1L_2}{L^2}(V_1-V_2) - \frac{RL_2}{L}V_1 -$$

$$\frac{L_1R_2}{L}(V_1-V_2) - R_f(V_1-V_2) + V_1R_2 + R_f(V_1-V_2)$$

$$= \frac{RL_1L_2}{L^2}(V_1-V_2) - \frac{L_1R_2}{L}(V_1-V_2) + V_1R_2 - \frac{RL_2}{L}V_1$$

$$= \frac{L_1}{L}\left(\frac{RL_2}{L} - R_2\right)(V_1-V_2) + \left(R_2 - \frac{RL_2}{L}\right)V_1$$

But from line parameter, $R_2/L_2=R/L$, i.e., $R_2=RL_2/L$. So the numerator becomes $$= \frac{L_1}{L}\left(\frac{RL_2}{L} - R_2\right)(V_1-V_2) + \left(R_2 - \frac{RL_2}{L}\right)V_1 \quad (A.19)$$

$$= \frac{L_1}{L}(R_2 - R_2)(V_1-V_2) + (R_2 - R_2)V_1$$

$$= 0$$

This means coefficient $K_2=0$ and eventually current $i_1(t)$ reduces to $$i_1(t) = K_1 + K_3 * e^{-(\lambda_L + \lambda_f)t} \quad (3)$$

So the current $i_1(t)$ can be represented through one exponent. In a similar fashion, expression for $i_2(t)$ can be derived and written as $$i_2(t) = K_1' + K_3'* e^{-(\lambda_L + \lambda_f)t} \quad (4)$$

Appendix B

Calculation of Coefficients

In this section, coefficients $K_1$ and $K_3$ are calculated for section III using the relevant data. From (A.13)

$$K_1 = s * I_1|_{s=0}$$

$$K_1 = s * \frac{(V_1 + sL_1I_0)(sL_2 + (R_2 + R_f)) - R_f(V_2 - sL_2I_0)}{s[(L_1L_2)s^2 + (L_1(R_2 + R_f) + L_2(R_1 + R_f))s + (R_1R_2 + R_1R_f + R_2R_f)]}\bigg|_{s=0}$$

$$K_1 = \frac{(V_1 + sL_1I_0)(sL_2 + (R_2 + R_f)) - R_f(V_2 - sL_2I_0)}{[(L_1L_2)s^2 + (L_1(R_2 + R_f) + L_2(R_1 + R_f))s + (R_1R_2 + R_1R_f + R_2R_f)]}\bigg|_{s=0}$$

$$K_1 = \frac{V_1(R_2 + R_f) - R_fV_2}{R_1R_2 + R_1R_f + R_2R_f}$$

$$K_1 = 2524.2843$$

Similarly, $$K_3 = (s + \lambda_L + \lambda_f) * I_1|_{s=-(\lambda_L + \lambda_f)}$$

$$K_3 = (s + \lambda_L + \lambda_f) *$$

$$\frac{(V_1 + sL_1I_0)(sL_2 + (R_2 + R_f)) - R_f(V_2 - sL_2I_0)}{(L_1L_2) * s(s + \lambda_L)(s + \lambda_L + \lambda_f)}\bigg|_{s=-(\lambda_L + \lambda_f)}$$

-continued $$K_3 = \frac{(V_1 + sL_1I_0)(sL_2 + (R_2 + R_f)) - R_f(V_2 - sL_2I_0)}{(L_1L_2)*s(s+\lambda_L)}\bigg|_{s=-(\lambda_L+\lambda_f)}$$

$$K_3 = -2487.6497$$

What is claimed is:

1. A method of protecting a DC feeder electrical power network, the method including the steps of:
   providing one or more circuit breaker arrangements which on activation isolate electrical faults within the network;
   sampling voltage and current of the network at a relatively high sampling rate;
   determining the occurrence of and location of a fault in the network based on the sampled voltage and current; and
   activating one or more of the circuit breaker arrangements in response to determining the occurrence of a fault, wherein
   said determining includes calculating a current derivative, and conducting three consecutive samplings of the voltage and current at up to about 1 MHz sampling rate.

2. A method as in claim 1, wherein said relatively high sampling rate is up to about 10 MHz.

3. A method of protecting a DC feeder electrical power network, the method including the steps of:
   providing one or more circuit breaker arrangements which on activation isolate electrical faults within the network;
   sampling voltage and current of the network at a relatively high sampling rate;
   determining the occurrence of and location of a fault in the network based on the sampled voltage and current; and
   activating one or more of the circuit breaker arrangements in response to determining the occurrence of a fault, wherein the DC feeder electrical power network comprises at least one of a DC microgrid feeder and high voltage DC (HVDC) lines.

4. A method as in claim 1, wherein said determining includes solving the equations:

$$v_1(t_1) = x\left[l*\frac{di_1(t_1)}{dt} + ri_1(t_1)\right] + R_f(m+1)(i_1(t_1) - I_0)$$

$$v_1(t_2) = x\left[l*\frac{di_1(t_2)}{dt} + ri_1(t_2)\right] + R_f(m+1)(i_1(t_2) - I_0),$$

where $v_1$, $v_2$, and the current derivative are measured at two different times $t_1$ and $t_2$, and $R_f$ is fault resistance, $di_1/dt$ is the current derivative, and x is the fault location.

5. A method as in claim 4, wherein solution for fault location x is determined by solving the equation:

$$x = \frac{\begin{vmatrix} v_1(t_1) & i_1(t_1) - I_0 \\ v_1(t_2) & i_1(t_2) - I_0 \end{vmatrix}}{\begin{vmatrix} l*\frac{di_1(t)}{dt}\bigg|_{t=t_1} + r*i_1(t_1) & i_1(t_1) - I_0 \\ l*\frac{di_1(t)}{dt}\bigg|_{t=t_2} + r*i_1(t_2) & i_1(t_2) - I_0 \end{vmatrix}},$$

where if voltage drop per unit length of time is denoted as $v_u(t)$, so that $$v_u(t) = l*\frac{di}{dt} + r*i,$$

solution for x reduces to:

$$x = \frac{\begin{vmatrix} v_1(t_1) & i_1(t_1) - I_0 \\ v_1(t_2) & i_1(t_2) - I_0 \end{vmatrix}}{\begin{vmatrix} v_u(t_1) & i_1(t_1) - I_0 \\ v_u(t_2) & i_1(t_2) - I_0 \end{vmatrix}}.$$

6. A method as in claim 3, wherein said relatively high sampling rate is up to about 1 MHz.

7. A method of protecting a DC feeder electrical power network, the method including the steps of:
   providing one or more circuit breaker arrangements which on activation isolate electrical faults within the network;
   sampling voltage and current of the network at a relatively high sampling rate;
   determining the occurrence of and location of a fault in the network based on the sampled voltage and current; and
   activating one or more of the circuit breaker arrangements in response to determining the occurrence of a fault, wherein the circuit breaker arrangements are placed only on the positive pole of the DC feeder electrical power network.

8. A method of detecting and handling faults in a DC power transmission or distribution system network using only single-ended local measurements in time domain, using closed-form deterministic solution for fault location, such method comprising:
   providing one or more circuit breaker arrangements which on activation isolate electrical faults within the network;
   conducting three consecutive samplings of the network voltage and current at a relatively high sampling rate of up to about 1 MHz;
   determining the occurrence of a fault in the network based on calculating a current derivative from the sampled voltage and current; and
   activating one or more of the circuit breaker arrangements in response to determining the occurrence of a fault.

9. A method as in claim 8, further including determining the location of the determined fault in the network using a closed-form deterministic solution for fault location.

10. A method as in claim 9, wherein solution for fault location x is determined by solving the equation:

$$x = \frac{\begin{vmatrix} v_1(t_1) & i_1(t_1)-I_0 \\ v_1(t_2) & i_1(t_2)-I_0 \end{vmatrix}}{\begin{vmatrix} l*\frac{di_1(t)}{dt}\bigg|_{t=t_1} + r*i_1(t_1) & i_1(t_1)-I_0 \\ l*\frac{di_1(t)}{dt}\bigg|_{t=t_2} + r*i_1(t_2) & i_1(t_2)-I_0 \end{vmatrix}},$$

where if voltage drop per unit length of time is denoted as $v_u(t)$, so that $$v_u(t) = l*\frac{di_1(t)}{dt} + r*i_1(t),$$

solution for x reduces to:

$$x = \frac{\begin{vmatrix} v_1(t_1) & i_1(t_1)-I_0 \\ v_1(t_2) & i_1(t_2)-I_0 \end{vmatrix}}{\begin{vmatrix} v_u(t_1) & i_1(t_1)-I_0 \\ v_u(t_2) & i_1(t_2)-I_0 \end{vmatrix}}.$$

11. A method as in claim 8, wherein the DC power transmission or distribution system network includes at least one of a DC microgrid feeder and high voltage DC (HVDC) lines.

12. A fault protection system for protecting a DC feeder electrical power network, the system comprising:
one or more circuit breaker arrangements which on activation isolate electrical faults within the network; and
one or more processors programmed for:
sampling voltage and current of the network at a relatively high sampling rate;
determining the occurrence of and location of a fault in the network based on the sampled voltage and current; and
activating one or more of the circuit breaker arrangements in response to determining the occurrence of a fault, wherein
the DC feeder electrical power network comprises at least one of a DC microgrid feeder and high voltage DC (HVDC) lines; and
the circuit breaker arrangements are placed only on the positive pole of the DC feeder electrical power network.

13. A fault protection system as in claim 12, wherein said one or more processors are further programmed for calculating a current derivative.

14. A fault protection system as in claim 13, wherein said relatively high sampling rate is in a range between 100 KHz and 10 MHz.

15. A fault protection system as in claim 13, wherein said one or more processors are further programmed for conducting three consecutive samplings of the voltage and current at up to about 1 MHz sampling rate.

16. A fault protection system as in claim 15, wherein one or more processors are further programmed for solving the equations:

$$v_1(t_1) = x\left[l*\frac{di_1(t_1)}{dt} + ri_i(t_1)\right] + R_f(m+1)(i_1(t_1)-I_0)$$

$$v_1(t_2) = x\left[l*\frac{di_1(t_2)}{dt} + ri_i(t_2)\right] + R_f(m+1)(i_1(t_2)-I_0),$$

where $v_1$, $v_2$, and the current derivative are measured at two different times $t_1$ and $t_2$, and $R_f$ is fault resistance, $di_1/dt$ is the current derivative, and x is the fault location.

17. A fault protection system as in claim 16, wherein said one or more processors are further programmed for solving for fault location x by solving the equation:

$$x = \frac{\begin{vmatrix} v_1(t_1) & i_1(t_1)-I_0 \\ v_1(t_2) & i_1(t_2)-I_0 \end{vmatrix}}{\begin{vmatrix} l*\frac{di_1(t_1)}{dt}\bigg|_{t=t_1} + r*i_1(t_1) & i_1(t_1)-I_0 \\ l*\frac{di_1(t_1)}{dt}\bigg|_{t=t_2} + r*i_1(t_2) & i_1(t_2)-I_0 \end{vmatrix}},$$

where if voltage drop per unit length of time is denoted as $v_u(t)$, so that $$v_u(t) = l*\frac{di_1(t)}{dt} + r*i_1(t),$$

solution for x reduces to:

$$x = \frac{\begin{vmatrix} v_1(t_1) & i_1(t_1)-I_0 \\ v_1(t_2) & i_1(t_2)-I_0 \end{vmatrix}}{\begin{vmatrix} v_u(t_1) & i_1(t_1)-I_0 \\ v_u(t_2) & i_1(t_2)-I_0 \end{vmatrix}}.$$

* * * * *